United States Patent
Petukhov

(10) Patent No.: US 10,846,443 B2
(45) Date of Patent: Nov. 24, 2020

(54) DISCRETE IRREGULAR CELLULAR MODELS FOR SIMULATING THE DEVELOPMENT OF FRACTURED RESERVOIRS

(71) Applicant: Petroleum Fractured Reservoir Solutions, LLC, Houston, TX (US)

(72) Inventor: Alexander V. Petukhov, Vsevolojsk (RU)

(73) Assignee: Petroleum Fractured Reservoir Solutions, LLC, Houston, TX (US)

( * ) Notice: Subject to any disclaimer, the term of this patent is extended or adjusted under 35 U.S.C. 154(b) by 646 days.

(21) Appl. No.: 14/799,339

(22) Filed: Jul. 14, 2015

(65) Prior Publication Data
US 2016/0196367 A1 Jul. 7, 2016

Related U.S. Application Data

(60) Provisional application No. 62/024,656, filed on Jul. 15, 2014.

(51) Int. Cl.
*G06F 30/20* (2020.01)
*E21B 43/26* (2006.01)
*G06F 17/10* (2006.01)

(52) U.S. Cl.
CPC .............. *G06F 30/20* (2020.01); *E21B 43/26* (2013.01); *G06F 17/10* (2013.01)

(58) Field of Classification Search
CPC ....... G06F 17/5009; G06F 17/10; E21B 43/26
USPC ............................................................ 703/2
See application file for complete search history.

(56) References Cited

U.S. PATENT DOCUMENTS

| | | | |
|---|---|---|---|
| 7,778,810 B2 | 8/2010 | Flandrin et al. | |
| 8,359,184 B2 * | 1/2013 | Massonnat | G01V 11/00 703/12 |
| 2010/0057418 A1 * | 3/2010 | Li | E21B 47/00 703/10 |

FOREIGN PATENT DOCUMENTS

| | | |
|---|---|---|
| WO | 2005076124 A1 | 8/2005 |
| WO | 2008070286 A2 | 6/2008 |
| WO | WO2013149307 A1 * | 10/2013 |

OTHER PUBLICATIONS

Anthony_2010 (Applying the Golden Ratio to Layouts and Rectangles, downloaded from http://uxmovement.com/content/applying-the-golden-ratio-to-layouts-and-rectangles/ dated Oct. 21, 2010).*
Fibonacci_2014 (Fibonacci Number Defined, Archived Wikipedia dated Jul. 10, 2014 downloaded from https://en.wikipedia.org/w/index.php?title=Fibonacci_number&oldid=616324235.*
(Continued)

*Primary Examiner* — Brian S Cook
(74) *Attorney, Agent, or Firm* — Mackey Law Firm PLLC

(57) ABSTRACT

An electronically stored model for a reservoir can include a plurality of hierarchical levels and a plurality of cells representing corresponding portions of the reservoir. The model can include a dimension and a cell number corresponding to the reservoir. A dimension of a cell of an nth hierarchical level can be defined in terms of a dimension of a cell of a first hierarchical level and an array of vertex coordinates along one or more axes can be generated. The model can include a ratio of dimensions among hierarchical levels for improved reservoir modeling. The model can include a ratio of permeability among hierarchical levels for improved reservoir modeling.

20 Claims, 13 Drawing Sheets

(56) References Cited

OTHER PUBLICATIONS

Anthony_2010 (Applying the Golden Ratio to Layouts and Rectangles, downloaded from http://uxmovement.com/content/applying-the-golden-ratio-to-layouts-and-rectangles/ dated Oct. 21, 2010) (Year: 2010).*

Fibonacci_2014 (Fibonacci Number Defined, Archived Wikipedia dated Jul. 10, 2014 downloaded from https://en.wikipedia.org/w/index.php?title=Fibonacci_number&oldid=616324235 (Year: 2014).*

PCT Search Report for PCT Application No. PCT/US2015/040431 dated Jan. 21, 2016.

PCT Written Opinion for PCT Application No. PCT/US2015/040431 dated Jan. 21, 2016.

* cited by examiner

| Number of heirarchical levels | Size heirarchical level (meters) | Number of cells pc. | Cell size (meters) | Permeability of the fracture, md |
|---|---|---|---|---|
| 1 | 9.349 | 9 | 1.039 | 25500.0 |
| 2 | 15.126 | 8 | 3.782 | 15760.2 |
| 3 | 24.475 | 8 | 6.119 | 9740.5 |
| 4 | 39.600 | 8 | 9.900 | 6020.1 |
| 5 | 64.072 | 8 | 16.018 | 3720.7 |
| 6 | 103.669 | 8 | 25.917 | 2299.6 |
| 7 | 167.737 | 8 | 41.934 | 1421.2 |
| 8 | 271.398 | 8 | 67.850 | 878.4 |
| 9 | 439.123 | 8 | 109.781 | 542.9 |
| 10 | 710.500 | 8 | 177.625 | 335.5 |
| 11 | 1149.589 | 8 | 287.397 | 207.4 |
| 12 | 1860.036 | 8 | 465.009 | 128.2 |
| Σ | 9700 | 97 | - | - |

FIG. 3

| Number of heirarchical levels | Size heirarchical level (meters) | Number of cells pc. | Cell size (meters) | Permeability of the fracture, md |
|---|---|---|---|---|
| 1 | 7.553 | 7 | 1.079 | 25500.0 |
| 2 | 12.221 | 10 | 2.444 | 15760.2 |
| 3 | 19.774 | 10 | 3.955 | 9740.5 |
| 4 | 31.994 | 10 | 6.399 | 6020.1 |
| 5 | 51.766 | 10 | 10.353 | 3720.7 |
| 6 | 83.758 | 10 | 16.752 | 2299.6 |
| 7 | 135.521 | 10 | 27.104 | 1421.2 |
| 8 | 219.272 | 10 | 43.854 | 878.4 |
| 9 | 354.783 | 10 | 70.957 | 542.9 |
| 10 | 574.038 | 10 | 114.808 | 335.5 |
| 11 | 928.794 | 10 | 185.759 | 207.4 |
| 12 | 1502.789 | 10 | 300.558 | 128.2 |
| 13 | 2431.512 | 10 | 486.302 | 79.2 |
| Σ | 12700 | 127 | - | - |

FIG. 4

| Block number $n_i$ | Linear block size $L_i$ (meters) | $X_1=n_{i+1}/n_i$ | $X_2=n_i/n_{i+1}$ | $X_1+X_2$ | Linear block size $L_i/10$ (meters) | Fibonacci series |
|---|---|---|---|---|---|---|
| $n_1$ | 22 | 1.55 | 0.65 | 2.2 | 2.2 | 2 |
| $n_2$ | 34 | 1.35 | 0.74 | 2.1 | 3.4 | 3 |
| $n_3$ | 46 | 1.61 | 0.62 | 2.2 | 4.6 | 5 |
| $n_4$ | 74 | 1.35 | 0.74 | 2.1 | 7.4 | 8 |
| $n_5$ | 100 | 1.60 | 0.62 | 2.2 | 10 | 13 |
| $n_6$ | 160 | 1.37 | 0.73 | 2.1 | 16 | 21 |
| $n_7$ | 220 | 1.55 | 0.65 | 2.2 | 22 | 34 |
| $n_8$ | 340 | | | | 34 | 55 | model building fractured reservoir creation of a model | rendering model size of the model
X: 2000 M
Y: 2000 M
Z: 100 M number of cells
X: 19
Y: 19
Z: 2 depth 1800 M
ratio 1.618 permeability units of the axis
X: 132 Мд
Y: 132 Мд
Z: 13.2 Мд porosity 0.2 Д.еД

☐ use dual permeability model permeability of cracks along the axes
X: 10000 Мд
Y: 10000 Мд
Z: 1000 Мд

☑ use the model of dual porosity fracture porosity 0.02 Д.еД

Note: When you activate the dual permeability should indicate the permeability of the largest (central) cracks build a model

FIG. 12

DISCRETE IRREGULAR CELLULAR MODELS FOR SIMULATING THE DEVELOPMENT OF FRACTURED RESERVOIRS

CROSS REFERENCE TO RELATED APPLICATIONS

This application claims the benefit of U.S. Provisional Patent Application No. 62/024,656 filed on Jul. 15, 2014, the entire contents of which are hereby incorporated by reference into this disclosure.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

Field of the Invention

The embodiments disclosed herein relate generally to modeling oilfield formations, and more specifically relate to methods and systems for creating non-uniform discrete cellular models and simulating the development of oil and gas in fractured reservoirs using those models.

Description of the Related Art

Conventional simulations of oil and gas production may involve the use of uniform cellular, or mesh, models that can be relatively detailed, such as involving millions of cells, or less detailed, such as involving hundreds of thousands of cells. In other words, a conventional model can include a structure wherein all the cells of one hierarchical level are the same, or are uniform (e.g., square), which is an ideal case and may differ significantly from a more chaotic arrangement of a natural (or physical) system being modeled. Typically, a hydrodynamic model may be constructed on the basis of a pre-built geological model. For example, the hydrodynamic simulation model may adapt to the history of development of a field, calculations of planned development options, predictive recovery factors or choices of optimal development scenarios based on analyses of possible activities in drilled wells. Some modeling processes are beginning to move to the use of non-uniform grids, but for purposes of improving the quality of the calculations and not necessarily to get closer to the natural system. In other words, relations between cell sizes may be chosen empirically depending on the task and the cell dimensions may be reduced to increase their number and potentially improve the accuracy of calculations. Additionally (or separately), conventional models may include only a mean value for permeability, which can limit the effectiveness or accuracy of a model.

One of the purposes of geological modeling may be to provide a detailed reflection of reservoir heterogeneity. For this reason (among others), a geological grid may be selected to have a large number of cells in hopes of being sufficiently detailed for an analysis. Because of such a high resolution, performing full-scale hydrodynamic calculations directly on the geological grid can be difficult or impractical because it can require a substantial amount of time or processing resources. Therefore, in order to convey a geological model for subsequent reservoir simulation, the resolution of the geological model may be reduced.

Applicant has created systems and methods for constructing improved irregular mesh models and for simulating the development of oil and/or gas in fractured reservoirs using those models. The systems and methods of the present disclosure can be used by specialists, engineers or others in the field of modeling oil and gas formations and, in at least one embodiment, can be adapted for use in other fields, such as for simulating earthquakes or the effects of earthquakes on the Earth's crust.

BRIEF SUMMARY OF THE INVENTION

In at least one embodiment, a computer-implemented method of modeling a reservoir can comprise creating, in computer readable storage, an electronically stored model comprising a plurality of hierarchical levels, wherein each of the plurality of hierarchical levels comprises a plurality of cells representing corresponding portions of a reservoir. The method can include inputting, receiving or processing one or more dimensions, such as an overall dimension(s), or numbers of cells, of the reservoir along one or more axes, which can include a first, second, third, X, Y, Z or other axis. The method can include defining, calculating, processing or creating a dimension of a cell of one or more hierarchical levels, such as a first hierarchical level, along one or more axes according to the equations disclosed herein, and can include defining, calculating, processing or creating a dimension of a cell of one or more other hierarchical levels, such as an nth hierarchical level, along the one or more axes according to the equations disclosed herein. The method can include defining, calculating, processing or creating a dimension of a cell along an axis for each of the plurality of hierarchical levels and generating one or more arrays, such as a first array, of vertex coordinates along the axis. An array of vertex coordinates can include a zero coordinate and a last coordinate on an axis.

In at least one embodiment, a method can include defining, calculating, processing or creating a dimension of a model along one or more axes according to the equations disclosed herein. In at least one embodiment, a zero coordinate can correspond to a peak, such as a first peak, and a last coordinate can be equal to Xs. The method can include at least one of changing a size of at least one cell in a preexisting reservoir model, reducing a number of cells in a preexisting reservoir model, and a combination thereof, which can include maintaining an overall size of the preexisting reservoir model (or a portion thereof) the same. In at least one embodiment, a method can include defining a ratio of hierarchy levels ($\tau$) as 1.618 for at least one aspect of the model, such as one or more dimensions or one or more permeabilities.

In at least one embodiment, a method can include inputting, receiving, defining, calculating, processing or creating a dimension, such as an overall dimension, of a reservoir along a second, third or other axis, as well as a number of cells along the axis. The method can include defining, calculating, processing or creating a dimension of a cell of one or more levels, such as a first hierarchical level, along the second, third or other axis according to the equations disclosed herein, wherein the variable X in an equation can, but need not, be a Y, Z or other character. The method can include defining, calculating, processing or creating a dimension of a cell of an nth hierarchical level along the second, third or other axis according to the equations disclosed herein, wherein the variable X in an equation can, but need not, be a Y, Z or other character, and can include defining, calculating, processing or creating a dimension of a cell along the axis for each of the plurality of hierarchical levels. The method can include generating one or more additional arrays, such as second, third or other arrays, of vertex coordinates along the axis, which array(s) can include a zero coordinate and a last coordinate on the axis. Two or more of the axes can be perpendicular to one another. The method can include defining a dimension for each of a plurality of cells in each of a plurality of hierarchical levels along one or more other axes, such as a third axis, and can include displaying an electronically stored model on a display. In at least one embodiment, a method can include inputting, receiving, defining, calculating, processing or creating a fracture permeability of one or more of a plurality of hierarchical levels in one or more directions, which can include determining a fracture permeability of an nth hierarchical level according to the equations disclosed herein. The method can include defining a ratio of hierarchy levels ($\tau$) as 1.618 for one or more attributes of a model, such as one or more dimensions or one or more permeabilities.

In general, in another aspect, the exemplary embodiments include a computer-based system for modeling a reservoir. A computer-based system according to the disclosure can include a processing unit, such as a unit mounted within the computer-based system, a data input unit connected to the central processing unit, the data input unit receiving data for a reservoir, such as a hydrocarbon reservoir, a database connected to the central processing unit, the database storing the data for the reservoir, and a storage device connected to the central processing unit, the storage device storing computer-readable instructions, such as therein or thereon. The computer-readable instructions can be executable by the central processing unit to perform one or more of the methods of modeling a reservoir substantially as described above. In general, in yet another aspect, the exemplary embodiments include a computer-readable medium storing computer-readable instructions for causing a computer to model a reservoir, which can include creating one or more reservoir models substantially as described in the present disclosure. The computer-readable instructions can include instructions for causing a computer to perform one or more of the methods of modeling a reservoir substantially as described above, which can include creating one or more reservoir models substantially as described in the present disclosure.

BRIEF DESCRIPTION OF THE SEVERAL VIEWS OF THE DRAWINGS

FIG. 3 is a table showing calculation results for hierarchical levels and sizes of blocks along an X-axis for one of many embodiments of a model according to the disclosure.

FIG. 4 is a table showing calculation results for hierarchical levels and sizes of blocks along a Y-axis for one of many embodiments of a model according to the disclosure.

FIG. 12 is another view of the interface of FIG. 11.

DETAILED DESCRIPTION

As an initial matter, it will be appreciated that the development of an actual, real commercial application incorporating aspects of the disclosed embodiments will require many implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would nevertheless be a routine undertaking for those of skill in this art having the benefits of this disclosure. It also should be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," "axis," "X axis" and the like, used in the written description are for clarity in specific reference to the drawings and are not intended to limit the scope of the disclosure. As used herein, the terms formation and reservoir are synonymous unless otherwise indicated, and both terms can include an entire formation or a portion of a formation.

Figure 1:
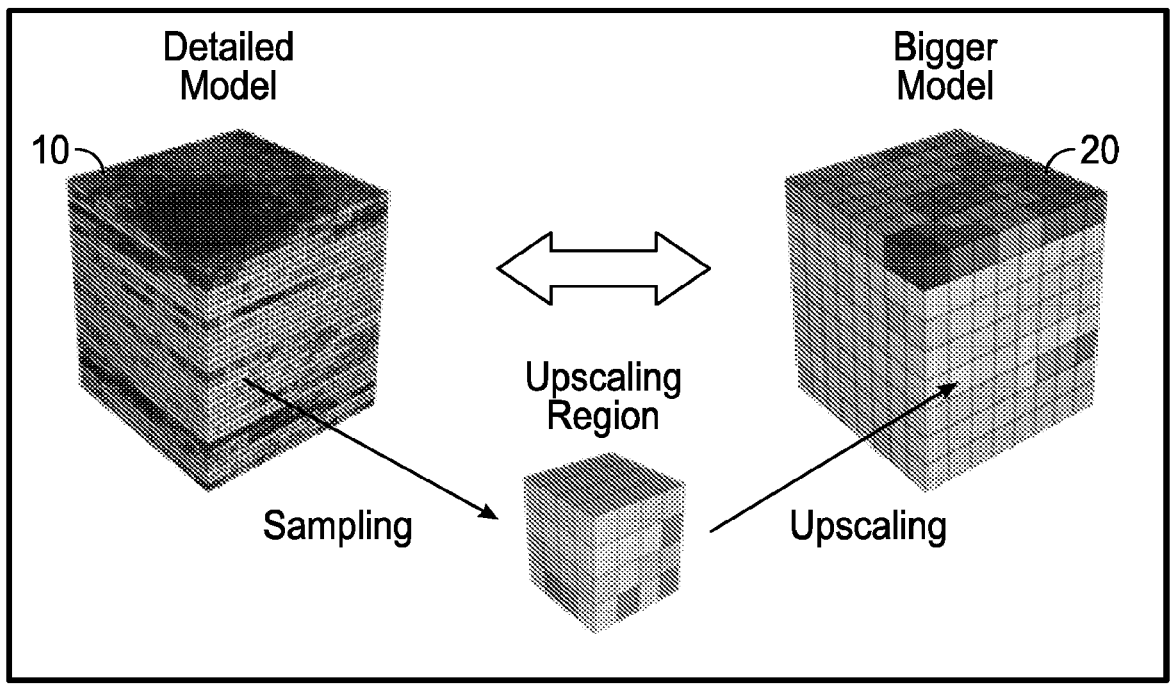
FIG. 1 is a flow diagram illustrating a method for implementing one of many embodiments of a hydraulic fracturing model according to the disclosure.
Figure 2:
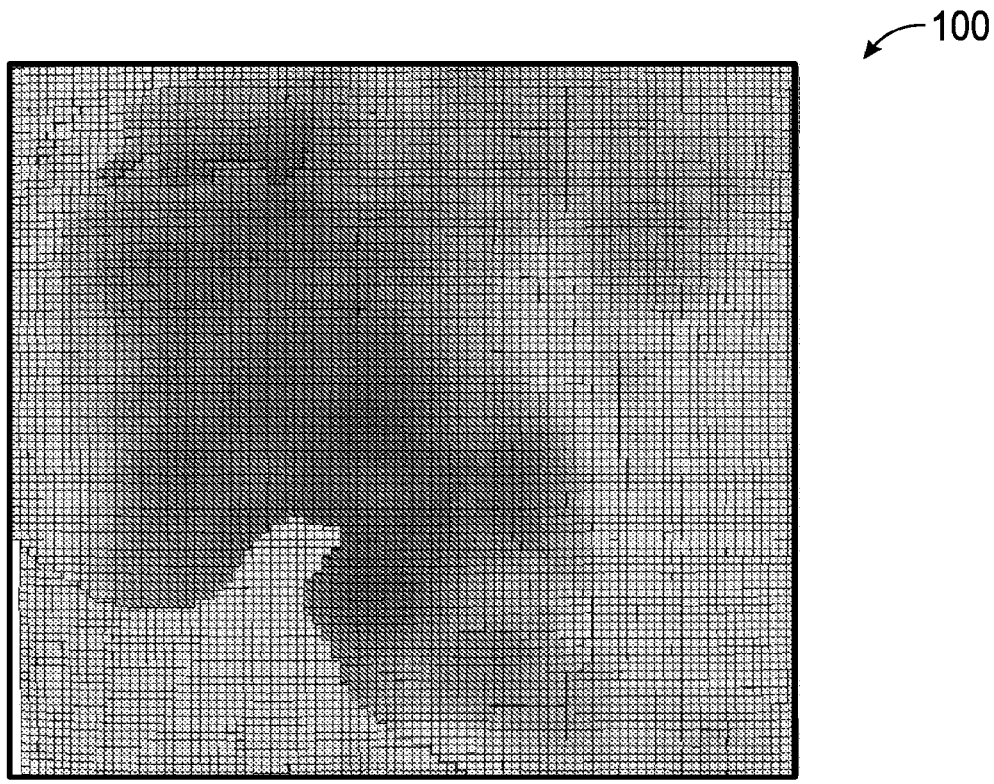
FIG. 2 is a top view of one of many embodiments of a hydrodynamic model according to the disclosure.
Figure 5:
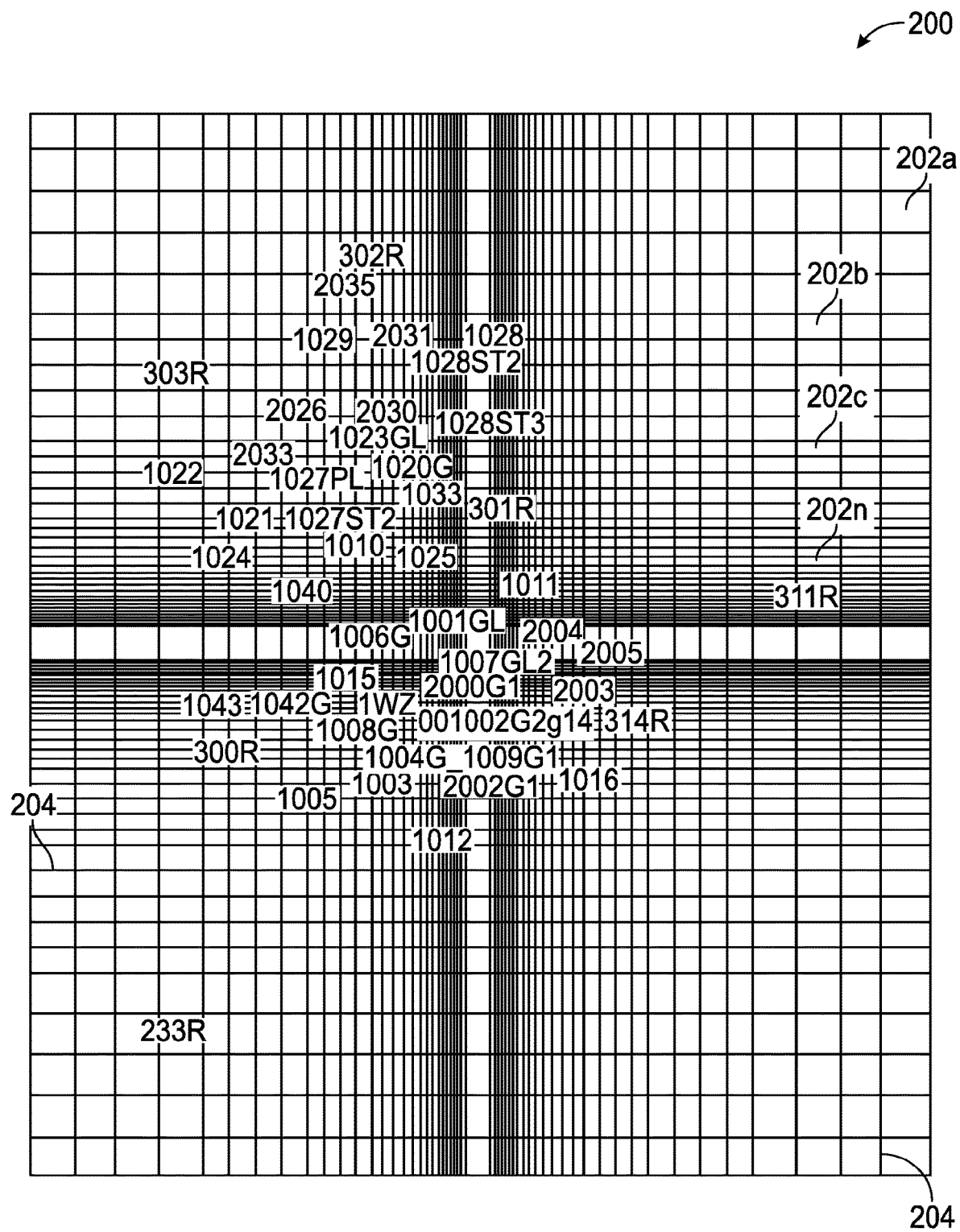
FIG. 5 is a top view of one of many embodiments of a hydrodynamic model according to the disclosure.
Figure 6:
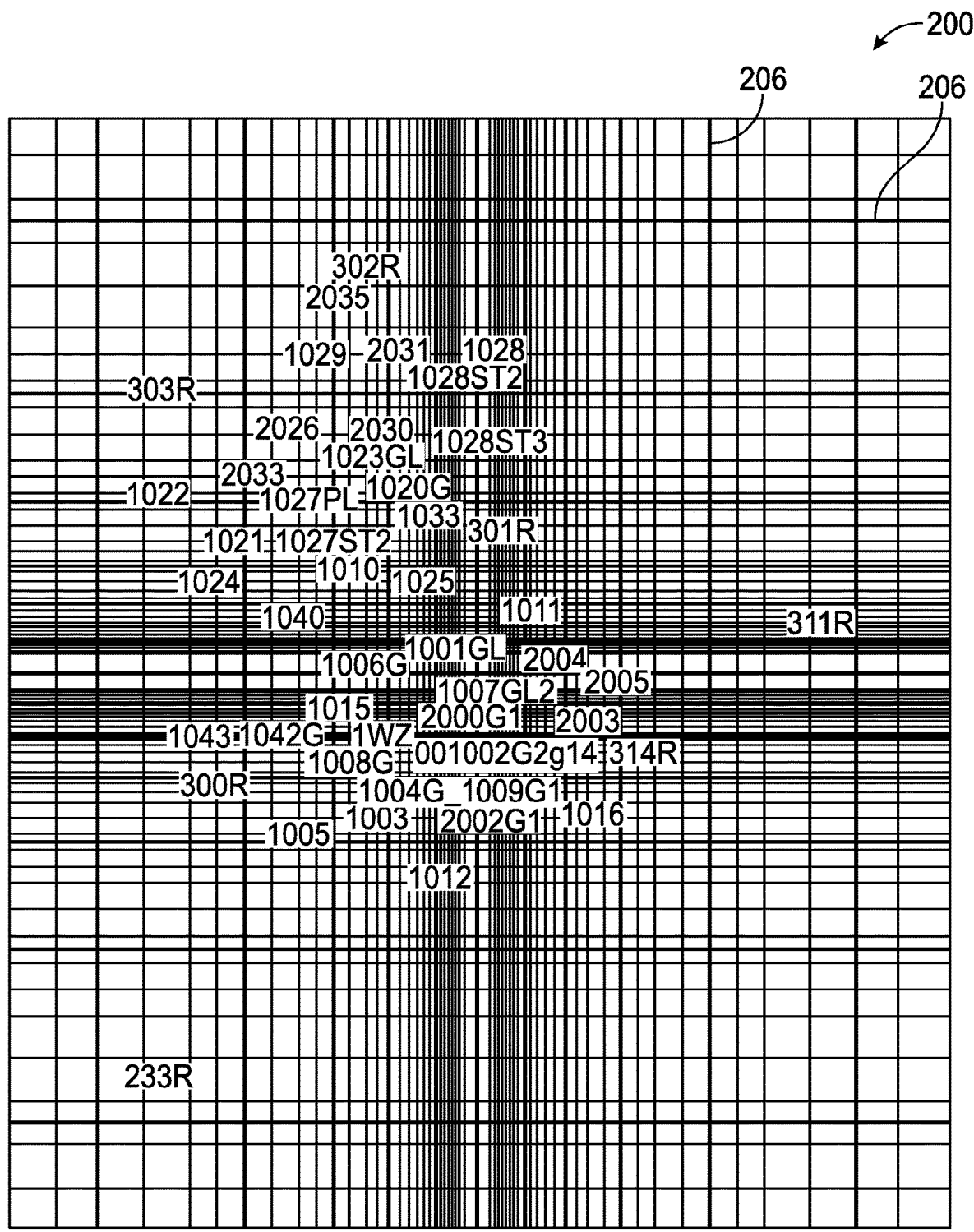
FIG. 6 is a top view of another of many embodiments of a hydrodynamic model according to the disclosure.
Figures 7, 8:
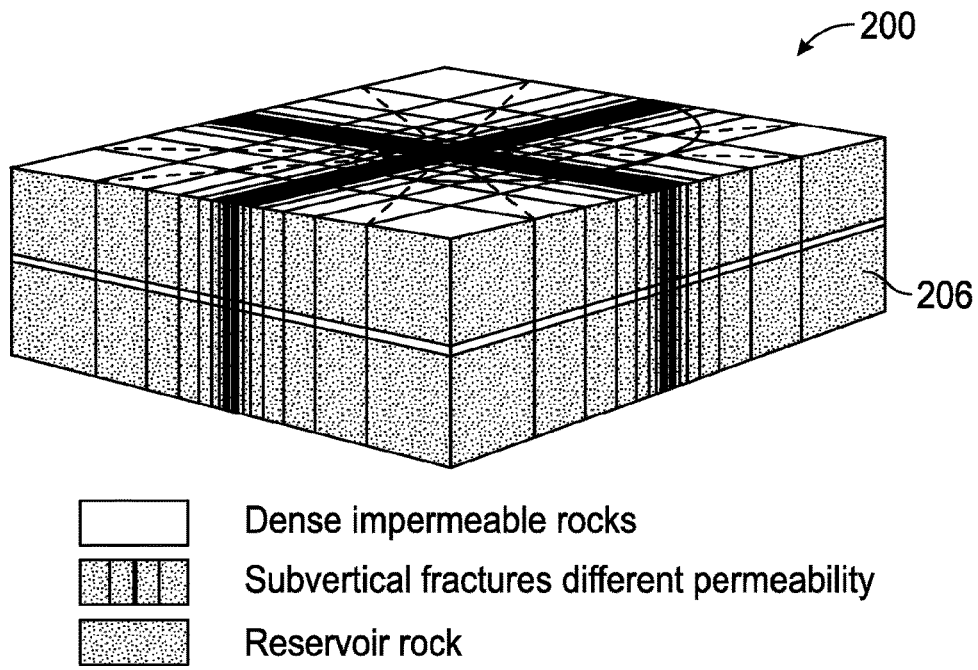
FIG. 7 is a perspective view of another of many embodiments of a hydrodynamic model according to the disclosure.
FIG. 8 is a table showing numbers and sizes of blocks for one of many embodiments of a model according to the disclosure.
Figure 9:
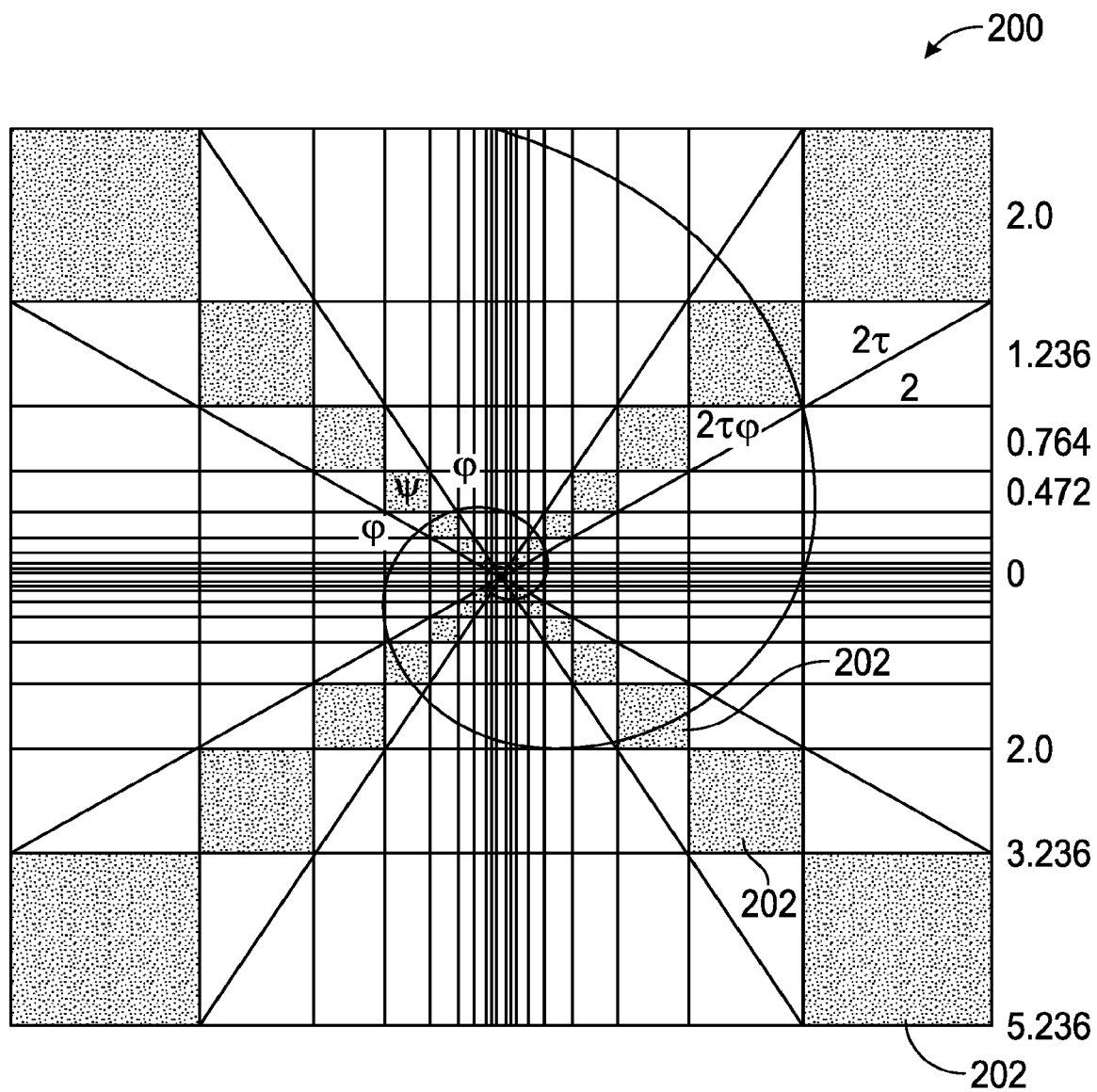
FIG. 9 is a top view of one of many embodiments of a model according to the disclosure.
Figure 10:
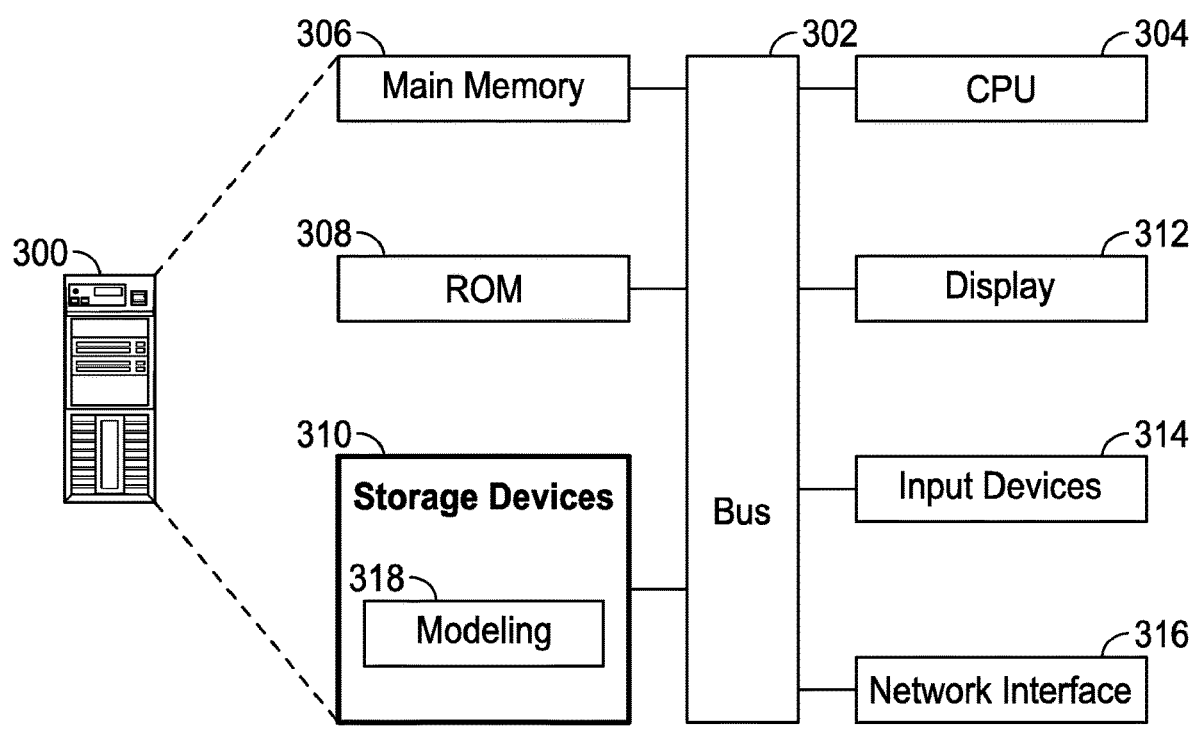
FIG. 10 is a schematic diagram illustrating one of many systems for performing all or at least a portion of the design and modeling processes according to the disclosure.
Figure 11:
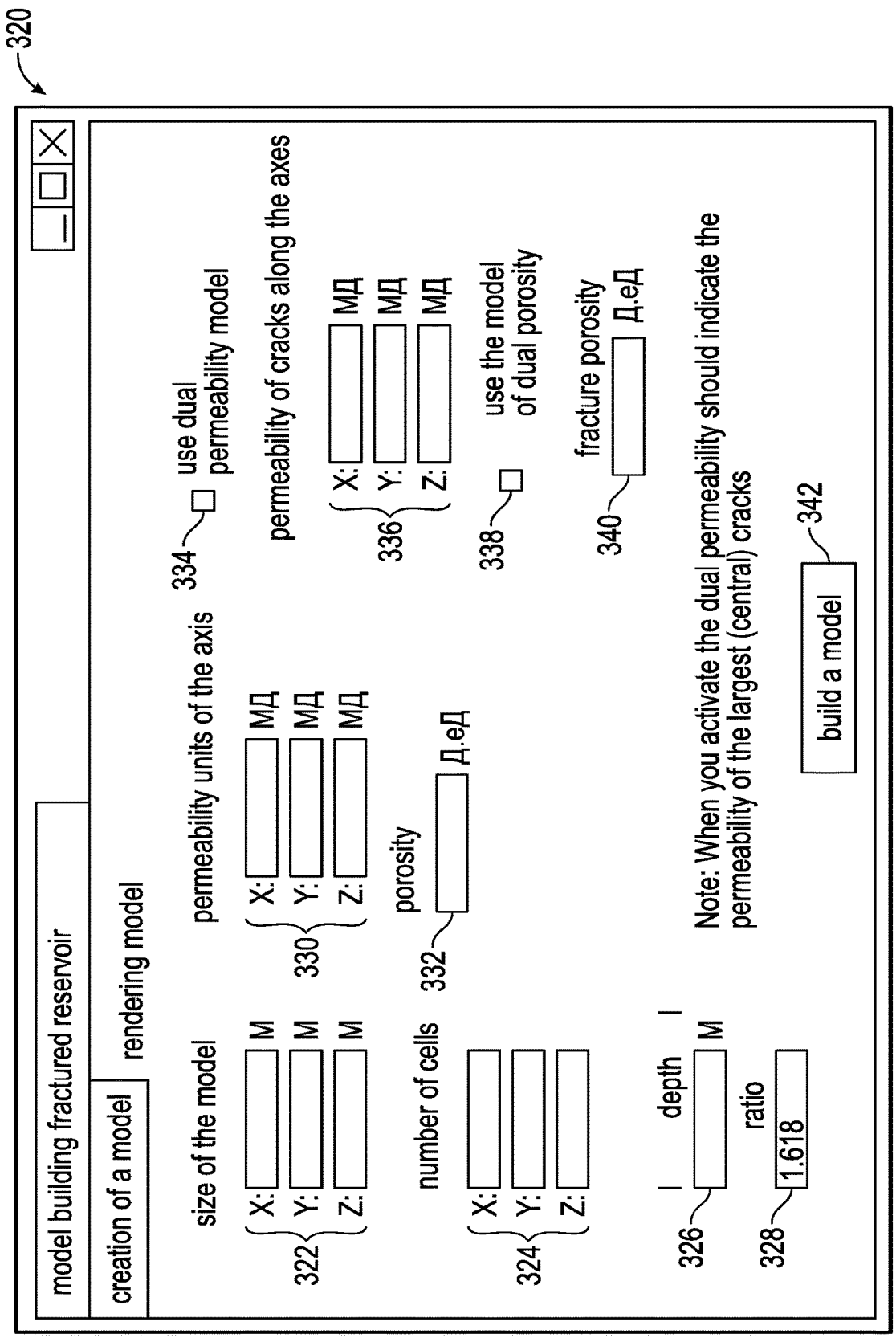
FIG. 11 is a schematic diagram illustrating one of many embodiments of a program interface according to the disclosure.
Figure 13:
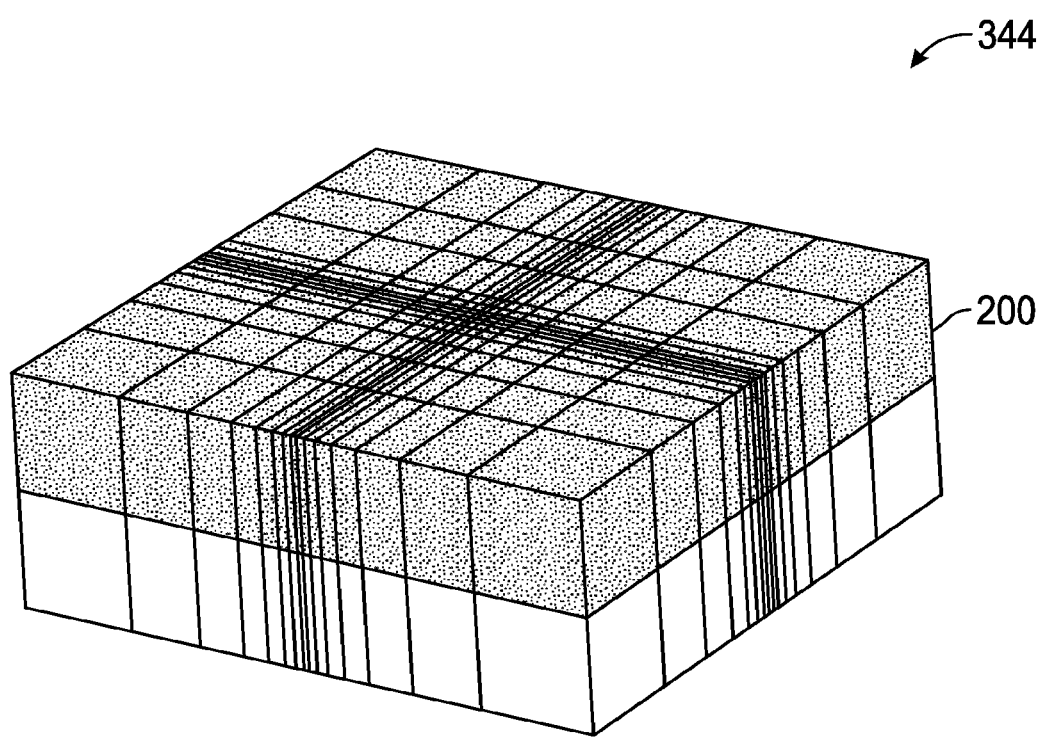
FIG. 13 is a schematic diagram illustrating one of many embodiments of a model interface according to the disclosure.
Figure 14:
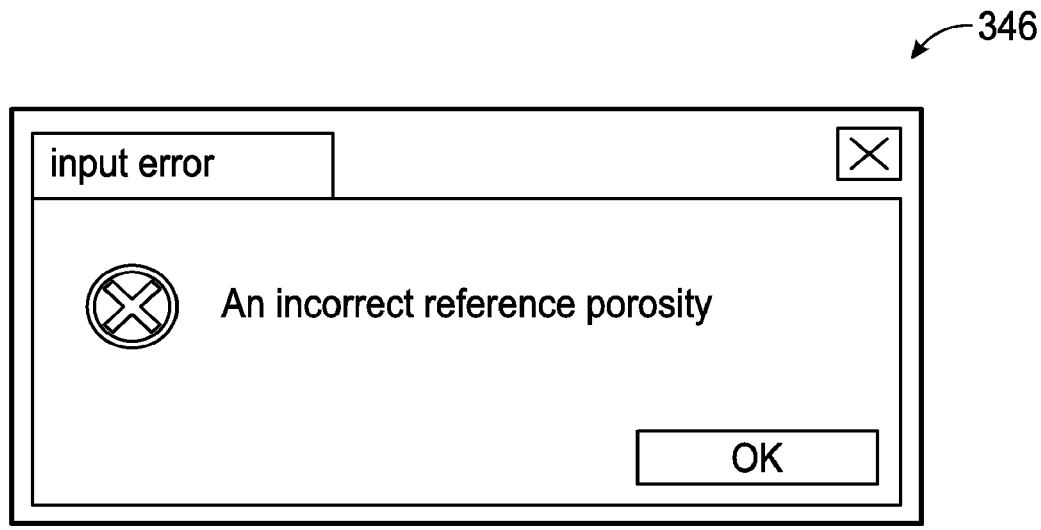
FIG. 14 is a schematic diagram illustrating another of many embodiments of an interface according to the disclosure.
Figure 15:
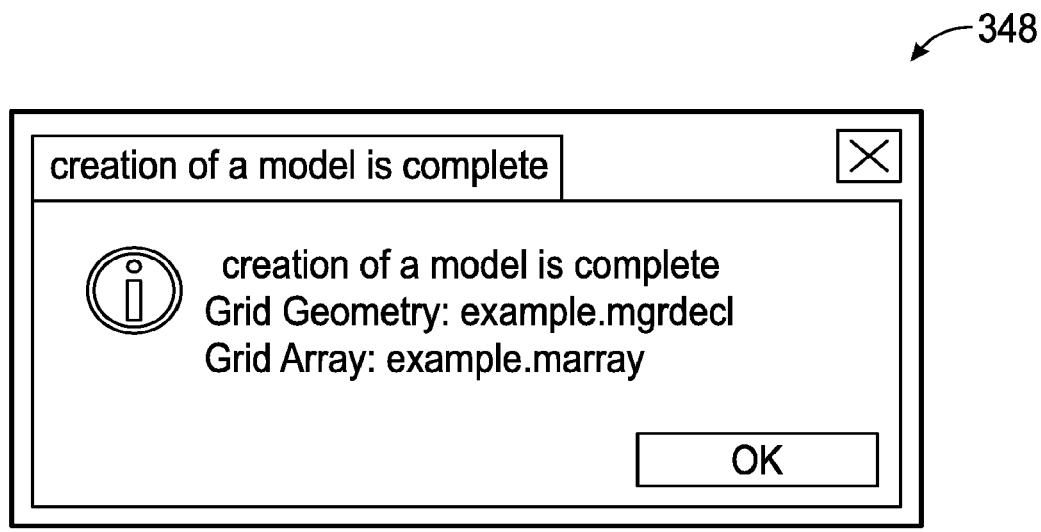
FIG. 15 is a schematic diagram illustrating yet another of many embodiments of an interface according to the disclosure.
Figure 16:
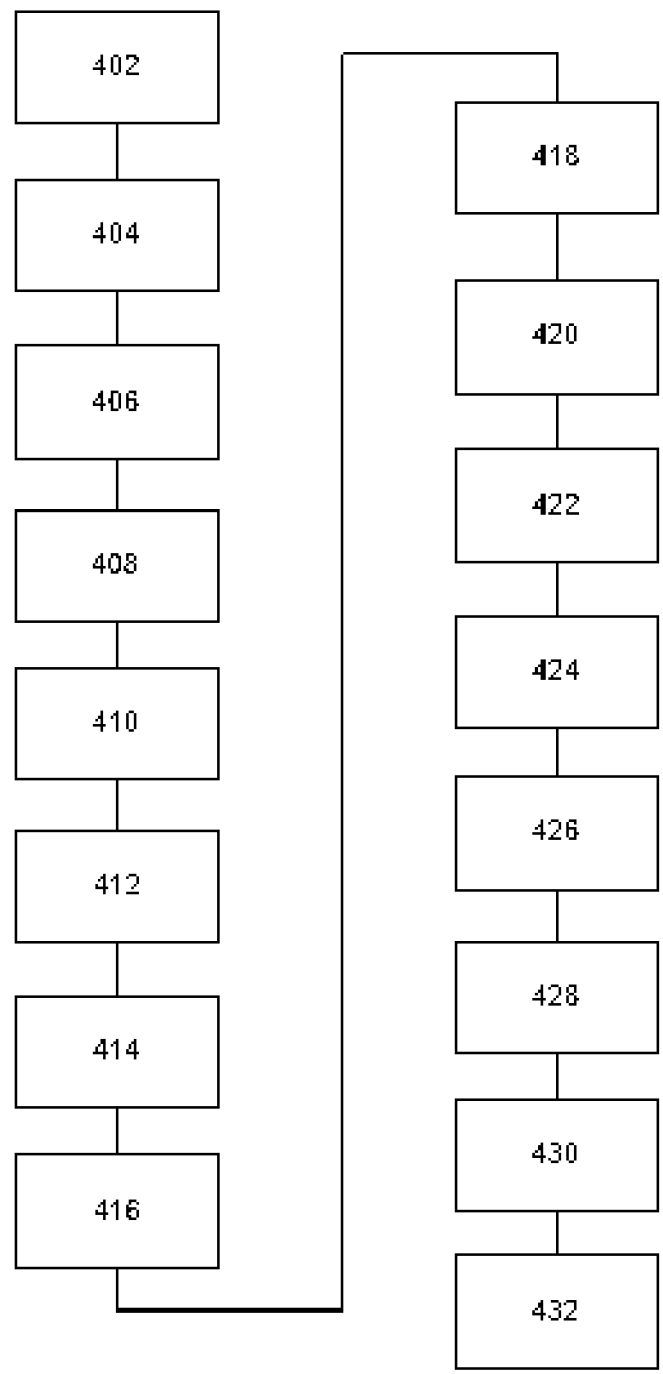
FIG. 16 is another flow diagram illustrating a method for implementing one of many embodiments of a hydraulic fracturing model according to the disclosure.

Applicant has created systems and methods for improving estimations of production from wellbores. The systems and methods of Applicant's disclosure can help minimize a learning curve associated with a wellbore or formation and, in at least one embodiment, can include providing optimized fracture design parameters based on hydrodynamic analyses combined with geological, geophysical, and/or petrophysical knowledge. FIG. 1 is a flow diagram illustrating a method for implementing one of many embodiments of a hydraulic fracturing model according to the disclosure. FIG. 2 is a top view of one of many embodiments of a hydrodynamic model according to the disclosure. FIG. 3 is a table showing calculation results for hierarchical levels and sizes of blocks along an X-axis for one of many embodiments of a model according to the disclosure. FIG. 4 is a table showing calculation results for hierarchical levels and sizes of blocks along a Y-axis for one of many embodiments of a model according to the disclosure. FIG. 5 is a top view of one of many embodiments of a hydrodynamic model according to the disclosure. FIG. 6 is a top view of another of many embodiments of a hydrodynamic model according to the disclosure. FIG. 7 is a perspective view of another of many embodiments of a hydrodynamic model according to the disclosure. FIG. 8 is a table showing numbers and sizes of blocks for one of many embodiments of a model according to the disclosure. FIG. 9 is a top view of one of many embodiments of a model according to the disclosure. FIG. 10 is a schematic diagram illustrating one of many systems for performing all or at least a portion of the design and modeling processes according to the disclosure. FIG. 11 is a schematic diagram illustrating one of many embodiments of a program interface according to the disclosure. FIG. 12 is another view of the interface of FIG. 11. FIG. 13 is a schematic diagram illustrating one of many embodiments of a model interface according to the disclosure. FIG. 14 is a schematic diagram illustrating another of many embodiments of an interface according to the disclosure. FIG. 15 is a schematic diagram illustrating yet another of many embodiments of an interface according to the disclosure. FIG. 16 is another flow diagram illustrating a method for implementing one of many embodiments of a hydraulic fracturing model according to the disclosure. FIGS. 1-16 will be described in conjunction with one another.

In at least one embodiment, a method according to the disclosure can include converting a model having a first number of cells, which can be any number of cells, to a model having a second number of cells smaller than the first number of cells, which can include creating a relatively larger hydrodynamic grid and combining it with one or more geological parameters. In other words, the systems and methods of the present disclosure can be considered contrary to the teachings of one or more conventional systems, such as conventional systems (and corresponding methods) wherein a number of model cells is increased or maximized, for example for increasing the detail of the model. In at least one embodiment, a method can include transitioning a detailed grid to a courser grid for modeling a wellbore, which can include implementing one or more rules or other conditions. For example, in at least one embodiment, a grid can include the smallest number of cells possible under the circumstances, which, in at least some cases, can be the minimum number of cells needed to maintain a distribution of the heterogeneity of formation properties or characteristics as reflected by the detailed grid, which can be any detailed grid according to an embodiment. In at least one embodiment, other rules can include creating one or more cells having a shape, such as a shape in a plane, which can include creating a rectangular cell or an approximately rectangular cell, and modelling a fault line as gently as possible under the parameters of an embodiment at hand. In at least one embodiment, a rule can include creating a courser grid having one or more flow lines while maintaining one or more flow line directions the same or about the same as a flow line direction(s) on a detailed grid.

In at least one embodiment, a method can include transitioning from a geological model to a hydrodynamic model, which can be divided into one or more intermediate or intervening steps, or stages. With reference to FIG. 1, a method can include upgridding, or upscaling, a model for transitioning from a "small" mesh model 10 (i.e., model having a mesh comprising a relatively larger number of cells having relatively smaller cell dimensions) to a "large" mesh model 20 (i.e., a model having a mesh comprising a relatively smaller number of cells having relatively larger cell dimensions), which can include constructing a new model having a less detailed hydrodynamic grid. As another example, a method can include one or more additional steps for converting a model, such as sampling, upscaling and assessment steps. Sampling can include determining a correspondence between one or more models, such as between a geological mesh and a hydrodynamic mesh, which can include averaging values associated with one grid and applying the average values to another grid. Upscaling can include averaging one or more properties, such as static and/or dynamic parameters, of one model (e.g., a detailed geological model) and approximating values within another model (e.g., a less detailed hydrodynamic model). An assessment, or assessing, step can include evaluating, analyzing or otherwise assessing the results of one or more steps, such as by assessing a quality or accuracy of averaging. In at least one embodiment, a method can include verifying a proper or otherwise desired transition from a coarse to a detailed model, or vice versa, which can include verifying preservation of one or more features, such as distribution properties, from one model to another model, such as from a geological model to a hydrodynamic model, or a hydrodynamic model to a geological model.

In at least one embodiment, a method can include, rebuilding an existing model, which can include rebuilding grid vertex units of a model and constructing a distribution of fracture permeability within the model. A new or modified grid can be constructed, such as by building a series of coordinates along one or more axes of a model, such as an X axis, Y axis, Z axis, or other axis, which can be any axis, whether separately or in combination, in whole or in part. In at least one embodiment, a method for, or algorithm for, generating an array of vertex coordinates units along an axis (e.g., an "X" axis for purposes of illustration, which can be or include any axis extending in any direction), can include determining the size of one or more nominal units on one or more levels of a model, such as a hierarchical level (e.g., a 1st, 2nd, 3rd, 4th . . . nth hierarchical level, or hierarchical levels 1, 2, 3, 4 . . . n), which can include defining a size of a model along the X axis (for example) in nominal units.

In at least one embodiment, the size(s) of a nominal unit can be denoted as $x_1$ for a block in a first hierarchical level (Level 1), $x_2$ for a block in a second hierarchical level (Level 2) . . . $x_n$ for a block in an nth hierarchical level (Level n), where n can be any number according to an embodiment or application of an embodiment. In at least one embodiment, the size of a block of an nth hierarchical level expressed in terms of a size of a block in a 1st hierarchical level in nominal units can be equal to:

$$x_n = \tau^{n-1} x_1 \qquad (1)$$

wherein $\tau$ is the ratio of hierarchy levels, n is the hierarchical level, $x_n$=the block of an nth hierarchical level and $x_1$ is the size of a block of a 1st hierarchical level in nominal units.

Accordingly, if the number of blocks along the axis is even, then the model can include two sets of Level 1 blocks adjacent to each other. If the number of blocks along the axis is odd, then the model can include one set of Level 1 blocks surrounded on both sides by blocks of the 2nd level, or Level 2 blocks. Thus, the size of a model (Xs) in blocks of a 1st hierarchical level can be expressed as:

$$Xs = \left(1 + \sum_{i=2}^{n} \tau^{i-1}\right) \cdot x_1, \quad (2a)$$

where $$n = \frac{Xc - 1}{2},$$

if an odd number of mocks Xc, $$Xs = \left(2 + \sum_{i=2}^{n} \tau^{i-1}\right) \cdot x_1, \quad (2b)$$

where $$n = \frac{Xc}{2} - 1,$$

if an even number or blocks Xc, wherein Xs is the size of the model in nominal units, Xc is the number of blocks in the nth hierarchical level, n is the hierarchical level, $x_1$ is the nominal size of a block of a 1st hierarchical level and i is the initial hierarchical level.

From Equations 2a and 2b (collectively, Equation 2), the size of a nominal block can be expressed as:

$$x_1 = \frac{Xs}{1 + \sum_{i=2}^{n} \tau^{i-1}}, \quad (3a)$$

where $$n = \frac{Xc - 1}{2},$$

if an odd number of blocks Xc, $$x_1 = \frac{Xs}{2 + \sum_{i=2}^{n} \tau^{i-1}}, \quad (3b)$$

where $$n = \frac{Xc}{2} - 1,$$

if an even number of blocks Xc, wherein $x_1$ is the size of a nominal block, Xs is the size of the model in nominal units, n is hierarchical level, i is the initial hierarchical level and Xc is the number of blocks in the nth hierarchical level. Equations 3a and 3b can be referred to collectively as Equation 3.

Thus, by determining the size of a block of a 1st hierarchical level (e.g., by Equation 1), a block size for all hierarchical levels can be determined and can make up an array of vertices for blocks along an axis (e.g., the X axis as described herein for illustrative purposes), wherein a first peak can correspond to a zero coordinate and a last coordinate can be equal to Xs. In at least one embodiment, a peak, such as a first peak, can be determined according to a seismic report for a formation, however a model according to the disclosure can, but need not, have one or more cells different in size from a block or square size reflected in a seismic report. For instance, in at least one embodiment, which is but one of many, a seismic report may reflect a block dimension of, e.g., 750-800 meters, which can be due to limitations of a seismic analysis. In other words, a seismic analysis may only pick up or "see" blocks of a particular size, such as a size larger than a desired size for a model according to the disclosure. In at least one embodiment, a model according to the disclosure can include a cell or block size of approximately half of that of a seismic report (e.g., approximately 375 meters for the example mentioned above), for example such that two or more maximum (or Level 1) model cells can fit within a seismic block or square, such as an average seismic square. Of course, this need not be the case, and other arrangements are possible. In at least one embodiment, a size or dimension of one or more model cells can be determined from reservoir data collected over time during operations. Of course, as will be understood by a person of ordinary skill having the benefits of the present disclosure, the aforementioned steps also can be used for creating an array of vertex coordinates for blocks along one or more other axes, such as a Y-axis, Z-axis or other axis, in which case the variable "X" as used in Equations 1-3 can be replaced with "Y," "Z," or another variable, which can be any variable.

In at least one embodiment, a system according to the disclosure can include an algorithm for generating an array of fracture permeability, which can incorporate one or more known parameters, such as a given permeability of a fracture of a 1st hierarchical level ($k_1$) and a given value of an average matrix permeability ($k_0$). Fracture permeability can vary according to hierarchical levels in accordance with a hierarchical relation $\tau$, but a degenerating fracture permeability can result in a situation where an intended fracture permeability is less than a permeability of a matrix, which may be impossible. That is, if the permeability of each subsequent crack (i.e., from one level to the next) decreases 1.618 times, then modeled fracture permeability can become less than an actual permeability of a producing formation. So, for example, if the biggest crack in a given formation has a permeability of 10 Darcy (d) (or approximately 10 square micrometers ($\mu m^2$), the permeability of each crack of each subsequent level can decrease by 1.618 times and thus, for instance, on the 10th level of the hierarchy the permeability will be only 132 millidarcy (md) (or 0.132 $\mu m^2$), which may be less than a matrix permeability, such as an average matrix permeability of approximately 140 md (0.140 $\mu m^2$). Therefore, in at least one embodiment, when fracture permeability of a hierarchy becomes less than a permeability of a producing formation at a particular hierarchical level (which can be or include any level(s)), permeability of such levels can be disregarded.

In at least one embodiment, a permeability of a fracture (or "crack") disposed in an nth hierarchical level can be equal to:

$$k_n = \begin{cases} \frac{k_1}{\tau^{n-1}}, & \frac{k_1}{\tau^{n-1}} > k_0 \\ k_0, & \frac{k_1}{\tau^{n-1}} \leq k_0 \end{cases} \quad (4)$$

wherein, $k_n$ is the permeability of a crack disposed in an nth hierarchical level, n is the hierarchical level, $\tau$ is the hierarchical relation, $k_1$ is the permeability of a fracture of a 1st hierarchical level and $k_0$ is the average matrix permeability.

With reference to FIGS. 2-15, some of many example embodiments of systems and methods according to the disclosure will now be described for illustrative purposes. More specifically, one or more aspects and results of a model constructed according to the systems and methods disclosed herein will be described for purposes of further illustrating to a person of ordinary skill in the art how to make and use one or more embodiments of the disclosure. However, it should be understood that the following examples are exemplary and not limitative, and that other embodiments and potential embodiments are possible.

In at least one embodiment, which is but one of many, an initial hydrodynamic model 100 (see FIG. 2) can include a size of 97h127h136 blocks, or cells. For example, a model can include a horizontal mesh size of 100×100 meters and a vertical mesh size based on geological data for a formation or reservoir at hand, which can be any formation or reservoir. After rebuilding the model in accordance with the algorithms and steps described herein, the model can retain its size of 97h127h136 cells, however, the sizes of one or more cells can change, and multiple cells can be selected, for example, in light of a scale of the model at one or more levels of the hierarchy. In at least one embodiment, a permeability value for a crack in a 1st hierarchical level (e.g., 25,500 md) can be obtained, such as from studies of the production and injection in one or more well deposits. An average value of a matrix permeability (e.g., 34 md) can be obtained, for example, from coring data, and the above-mentioned values can be used in constructing an orthogonal fracture system model. The location(s) of one or more cracks, such as cracks in a 1st (or other) hierarchical level, can be tied to wells drilled in one or more locations within or through a formation, and filtration data, such as a maximum fixed rate of filtration, can be chosen in accordance with research or other information reflecting that information. In this exemplary illustration, the location of the cracks in the 1st hierarchical level are tied to wells 1007 and 1015 in the locations shown in FIG. 5. The results for the particular example embodiment discussed herein, which is but one of many, are shown in FIGS. 3 and 4, wherein FIG. 3 demonstrates illustrative results for hierarchical levels and sizes of blocks along an X axis and FIG. 4 demonstrates illustrative results for hierarchical levels and sizes of blocks along a Y axis. In at least one embodiment, a system and method according to the disclosure can include not only deriving results of this nature, but also can include displaying these results to a user of the system, which can be or include any manner of display, such as by way of a graphical user interface (GUI) or other visual graphic(s) or image(s).

As shown in FIG. 5, a rebuilt model 200, or a model modified according to one or more of the systems and methods disclosed herein, such as a rebuilt hydrodynamic model, can include one or more irregular cells 202a . . . 202n corresponding to a natural distribution of blocks and/or cracks in a physical formation. In at least one embodiment, rebuilt model 200, such as a rebuilt hydrodynamic model, can include a simulation grid 204 that may not coincide with a grid of cracks. In at least one embodiment, a model 200 can include a preview of an approximate position of one or more cracks, such as the largest or other cracks of one or more hierarchical levels, which can be shown by mesh lines 206 over or otherwise in relation to the image of a corresponding or applicable reservoir model. For example, in the illustrative embodiment of FIGS. 6-7, which is but one of many, a preview of the approximate position of the largest cracks of the hierarchical levels is shown in bolded mesh lines 206 over the top-view and perspective-view images of the underlying reservoir model.

In at least one embodiment, a method can include modeling, which can include estimating, one or more characteristics of production from or development of a fractured wellbore using a model according to the disclosure, which can include any characteristics, such as, for example, cumulative oil production, cumulative oil production rate and water cut, among others. One or more modeled characteristics can, but need not, be modeled over a period of time, such as an estimated or actual period of production or other development time for a wellbore (e.g., in years, months, days or other increments). In at least one embodiment, a model can include cells of irregular shape(s), which can form a hierarchy of cells of different sizes, as well as cells (or blocks) delimiting cracks, which also can form a hierarchical system. The cells and cracks can be built on, or represented by a model including one or more of the algorithms disclosed herein, which can include one or more algorithms employing the statistical theory of complex systems and/or mathematical models of branching cracks, such as a phenomenological model, which can include that known in mathematical physics as the Cayley tree.

In at least one embodiment, a model according to the disclosure can include blocks having linear dimensions with a ratio of 1.618, as well as permeability values of cracks separating the blocks with a ratio of 1.618. Moreover, if the permeability of the largest crack in a 1st hierarchical level (e.g., the thickest line in the center as shown in FIG. 7) is, for example, 10 Darcy (D), which is but one example of many, the permeability of the fracture of the last tenth of a hierarchical level, which can limit the outermost blocks, may be only 132 md, which may roughly correspond to a matrix permeability of a reservoir pore in a block. In other words, in a system of cracks at this ratio, a fracture permeability of a porous matrix can degenerate and the smaller cracks can lose meaning.

Statistical theory of complex systems analysis of the development operations of many deposits shows that these complex natural systems show some self-organization. The seemingly chaotic development of fractures in productive rocks not only can contribute to a self-predetermining, power-law behavior and scale invariance of complex natural systems, but also can regulate the evolution of these systems as hierarchical self-similar fractal structures. Use of basic concepts of the statistical theory of complex systems shows that the hierarchical self-similar fractal structure is one of the universal features of the structure of complex systems in physics, biology, geology, seismology, genetics, economics, sociology and other fields of science. The distribution on the hierarchical levels suggests that the evolution of self-similar branched systems, such as the producing formation fragmented into numerous blocks of diverse dimension cracks, can be reduced to anomalous diffusion in ultra-metric space of a hierarchical system. In this case the stationary probability distribution for self-similar levels of a hierarchical network (system) takes a Tsallis form and can be defined as a power law:

$$p_n = \left[p_0^{-(Q-1)} + \frac{Q-1}{\Delta}n\right]^{-1/(Q-1)}; p_0 \equiv \left(\frac{2-Q}{\Delta}\right)^{\frac{1}{2-Q}}, \Delta \equiv \frac{D}{\epsilon} \quad (5)$$

wherein, $p_n$ is the stationary distributions of probability, $p_0$ is the maximum of probability, Q is the non-additivity parameter, $\Delta$ is a dispersion, D is the diffusion coefficient and $\in$ is the energy.

The main feature of random branched hierarchical systems is that in the transition to a lower (deeper) level, the system is divided into smaller subsystems, which comprise even smaller subassembly next levels, etc. From a statistical point of view, the hierarchical assemblies and subsystems depend on the complexity of the system (C), which by analogy with the entropy characterizes the disorder hierarchical relationship. The nature of distribution can distinguish three types of complex networks—exponential, Poisson and Power. However, the first two types are scaled graphs, and the latter does not have any scale in the spread of the random variable, so the main problem with the statistical description of complex hierarchical systems is that at high energies the i-th microstate ($\epsilon$i), defined by the law of Pareto, reduces to determining exponential and power-law distributions. One or more studies show that the transition from the exponential distribution to the deformation degree provides logarithmic and exponential functions. This deformation leads to a distribution Tsallis and responsible self-similar statistical system, which lacks a scale change random variable $\epsilon$i. Indeed, the self-similar (or more precisely, self-affine) probability distribution $p(\epsilon_i)$ is defined by:

$$p(\epsilon_i/\epsilon) = \epsilon_i^{-\tau}p(\epsilon_i) \quad (6)$$

wherein $p(\epsilon i)$ is the probability distribution, $\epsilon$ is the variation of scale, $\epsilon_i$ is the random variable and $\tau$ is the deformed similarity index, and according to which the variation of scale $\epsilon$, characterizing the change in the variable $\epsilon_i$, leads to the factorization of the probability density of the same scale, deformed similarity index $\tau$. Using the scaled variable $\in_i \equiv \epsilon_i/\epsilon$ and the function $\pi(\in_i) \equiv \in_i^\tau p(\in_i)$, the self-similarity condition reduces to a uniform probability distribution:

$$p(\epsilon_i) = \epsilon_i^{-\tau}\pi(\in_i), \in_i \equiv \epsilon_i/\epsilon \quad (7)$$

(the variables having the same meanings as those set forth above), which means that the decrease of the argument function $\pi(\in i)$ $\epsilon$ in time leads to the factorization of the probability of a random variable raised to a power-$\tau$. Lack of scale corresponds to the limits $\epsilon \to \infty$, $\in i \to 0$, where the factor $\pi(\in i)$ tends to a constant value and a power distribution takes the form of the law of Pareto:

$$pi = C\epsilon i^{-\tau} \quad (8)$$

with positive constants C, $\tau$, wherein C is the complexity of the system and $\tau$ is the deformed similarity index. For self-similar ensembles having a number of nodes (M) distributed by levels l=0, 1, 2 . . . n, according to a power law:

$$M = (l+1)^\alpha \quad (9)$$

with an exponent $\alpha > 1$, wherein a is a number of branches. If the limit $l \gg 1$ and the probabilities are written in the form:

$$M_l p_l = M_{l+1} p_{l+1} \quad (10)$$

wherein $M_l$ is a number of nodes distributed on the certain level, $p_l$ is the probability distribution of nodes and $_1p_l$ is the stationary probabilities of states on the implementation of the neighboring levels, an asymptotic of Tsallis's distribution shows that the condition of self-similarity holds for hierarchical tree branches (a) related to the non-additivity parameter (Q) by the following relationship:

$$\alpha = 1/Q - 1 \quad (11)$$

According to the theory of hierarchical relationships, the stationary probabilities of states on the implementation of the neighboring levels are associated with non-additive parameter (Q) and dispersion ($\Delta$) in the following recurrence relation:

$$p_{l+1} - p_l = -p_l^{Q/\Delta} \quad (12)$$

wherein $p_{l+1}$ is the stationary probabilities of states on the implementation of the neighboring levels, $p_l$ is the probability distribution of nodes, Q is the non-additivity parameter and $\Delta$ is the dispersion. When $l \gg 1$, this ratio is reduced to the stationary Fokker-Planck equation.

As a result, determining the complexity of a self-similar network can be obtained using a simple expression:

$$C(n) = \frac{Q-1}{Q} \cdot \frac{p_0^{Q-1}}{\Delta} \cdot p_n^Q n^{\frac{Q}{(Q-1)}} \quad (13)$$

wherein C(n) is the complexity of network with the number of n levels, Q is the non-additivity parameter, $p_0$ is the maximum of probability and $p_n$ is the stationary distributions of probability.

The calculations show that the establishment of a hierarchical relationship quickly increases the complexity of the statistical ensemble. With the increasing branched hierarchical tree complexity maximum monotonically increases from zero at $\alpha=1$ to infinity as $\alpha \to \infty$. With the change in the variance of the statistical ensemble behavior inherent in simple systems is observed in terms of the branch above the golden section $\alpha_+=1.618$, and decay with increasing complexity of the dispersion characteristic of the self-similar complex hierarchical systems, manifested in branched bounded interval $1 < \alpha < 1.618$. Studies conducted in many fields of the Timan-Pechora and West Siberian oil and gas provinces show that multi-scale crack rocks separated productive rocks into blocks of various sizes, which can be complex, self-similar fractal structures, and their behavior can be described by general universal laws.

As an example, FIG. 8 shows the linear dimensions (Li) of blocks of a productive reservoir of rocks located in the Pashninskogo field. One or more mathematical parameters that characterize relationships of neighboring blocks' characteristic dimensions can be calculated, such as the ratios of large to small (X1) and smaller to larger (X2), as well as their sum (X1+X2). FIG. 8 shows that, in at least some cases, the distribution of these dimensions can have an order and the values obtained can be arranged in a specific order. Thus, a complex natural system of reservoir rocks, which can have a random distribution of multi-scale fluid-tectonic fissures dividing it into blocks of different dimensions, which also can have a random distribution, can be organized or characterized as a mathematical sequence. In other words, order can be created from chaos. The right-most column of FIG. 8 shows the Fibonacci series for the subject example, which is but one of many. This series of numbers can be characterized by a certain self-organization, such as wherein each successive number of the set is obtained by adding the two previous numbers, and the ratio between these numbers can be characterized by the so-called "golden section" of 1.618. In the exemplary study of the Pashninskogo oilfield, eight linear dimensions of blocks were identified, i.e., eight hierarchical levels of the natural system of the productive reservoir. However, this need not be the case, and any number of linear dimensions or hierarchical levels can be identified in a reservoir. When comparing the set of linear block sizes with the Fibonacci series, it can be noted that the self-organization of the natural system of reservoir rocks in the Pashninskogo deposit (as developed by the producing wells located there) tend to the Fibonacci sequence, i.e., in terms of the Fibonacci series synergy certain acts of self-attractor natural objects can result in each successive level of cells being similar to a previous one. Thus, the first two dimension (L1 and L2) correspond to values slightly higher than the Fibonacci sequence of numbers and the following six linear dimensions, on the contrary, correspond to values somewhat less than the corresponding properties of the Fibonacci series. In at least one embodiment, this may indicate that the first two dimensions have already exceeded the Fibonacci series capacity, but the following six dimensions can be characterized by a certain growth opportunity for achieving a value ratio of 1.618, which can be typical of the Fibonacci numbers. In fact, during the present inventor's analyses of wells in the Pashninskogo field, the inventor determined that production from blocks with the dimensions of the first two hierarchical levels had been exhausted and production operations had ceased, but that production from subsequent hierarchical levels continued, approaching closer to the modeled relation between adjacent levels of 1.618. Of course, the examples discussed above with regard to the Pashninskogo field are but some of many and are discussed herein for illustrative purposes. Other applications and outcomes are possible. For instance, the present inventor has conducted similar analyses and identified similar self-organizations and strict ordering of block sizes with regard to the total cumulative oil production from wells in the Kharyaga oilfield in the Timan-Pechora province and the Krapivinsk oilfield in the West Siberian province. These studies show that natural oil saturated reservoirs can be considered complex self-similar fractal structures, and their behavior can be modeled using one or more of the systems and methods of the present disclosure.

In at least one embodiment, a method can include constructing one or more mesh models in which the linear dimensions of the blocks (aka cells or cellules) are in the ratio of 1.618 as between blocks in consecutive hierarchical levels. For example, as shown in FIG. 9 for illustrative purposes, a model 200 can include a hierarchical self-similar mathematical model of fractured rocks in a reservoir or formation, which can include a plurality of square or rect-angular blocks or cells 202a . . . 202n (collectively, cells 202) having an aspect ratio ($\varphi$) equal to 1.618. In at least one embodiment, a model can include blocks or cells having sizes representative of one or more portions of a fractured reservoir, such as portions including cracks formed in whole or in part by hydraulic fracturing operations. Such sizes can, but need not, be at least partially based on or derived from data corresponding to a physical (or real) formation, which can include values for production, such as cumulative oil production, and/or values for quantitative characteristics of a productive or other formation, such as, for example, one or more values for porosity, oil density, effective thickness, conversion factors, or other characteristics, separately or in combination, in whole or in part. In at least one embodiment, a relationship between blocks at different hierarchical levels can asymptotically approach a value of 1.618.

In at least one embodiment, a method as disclosed herein can include building one or more models for estimating properties or attributes of a formation, such as a mechanical model for modeling one or more characteristics of a formation. Models according to this disclosure can be one-dimensional ("1D"), two-dimensional ("2D") or three-dimensional ("3D"), and can be a lone model, such as a stand-alone model, or a collective model, such as by being a part of one or more other models, for example, an earth model, a reservoir model, or another model, such as a geological or hydrodynamic model. A model can comprise any data or other information according to an application. For example, model data can include information derived from mechanical or other testing, such as core analyses, and can include any of numerous characteristics associated with a formation, such as, for example, anisotropy, heterogeneity, pore pressure and other variables, such as in-situ stresses. Hydrocarbon formations can exhibit various types or shapes of fractures upon being subjected to hydraulic fracturing operations. For example, depending on the formation type and one or more of the other factors described herein (or other factors that may be known in the art), hydraulically fractured formations can exhibit simple fractures, complex fractures, complex fractures with fissure openings and others, such as complex fracture networks comprised of numerous fractures, which can include any type of fractures in fluid communication with one another, in whole or in part. The types of fractures in a particular formation or reservoir can relate to one or more characteristics of the formation and/or of the materials present in the formation. These characteristics can include, for example, anisotropy and brittleness, among others, such as mineralogy, rock strength, porosity, permeability, content of clay or other types of earth, total organic carbon ("TOC") content, thermal maturity, gas content, gas-in-place, organic content and organic maturity, separately or in combination, in whole or in part. The attributes and characteristics of a formation, and the types of fractures expected to result from hydraulic fracturing of such a formation, can affect one or more considerations when considering potential fracturing approaches, such as, for example, a completion focus. Other factors that can influence frac design can include the results of testing performed on a reservoir or formation, such as log and core analyses, which, if present, can be incorporated into one or more of the systems and methods disclosed herein.

The systems and methods of the present disclosure, can, but need not, be wholly or partially implemented by way of a computer-implemented model, and can be used during any phase of development of a formation, which can be any formation according to a particular application. For example, the systems and methods of the present disclosure can be used during exploration phases, well planning phases, well development phases and other phases, such as drilling optimization or completion optimization, separately or in combination, in whole or in part. In at least one embodiment, a method as disclosed herein can include creating, processing or otherwise analyzing a series of models, which can include 1D, 2D and/or 3D models, and estimating, recommending or otherwise identifying an optimal (or at least potentially advantageous in one or more ways) hydraulic fracturing ("HF") operation or "frac design" for a wellbore, which can include a single- or multi-stage frac design. For example, a method as disclosed herein can include analyzing a drilling model, analyzing a stress model, analyzing a basin model, analyzing a seismic model and analyzing one or more other models, such as a geographical (e.g., regional, local or otherwise) scale model, geological model, a numerical stress model or a thermal model, separately or in combination, in whole or in part. A method as disclosed herein can include modeling and analyzing any of numerous factors associated with one or more formations or wellbores, such as salt content, production, injection, sanding, geothermal and/or other factors, such as one or more of the factors or parameters described elsewhere herein. In at least one embodiment, one or more existing software applications can be used to develop or otherwise analyze one or more of the models described herein, such as the applications named elsewhere in this disclosure. However, this need not be the case, and alternatively, or collectively, one or more software applications can be independently developed for embodying the systems and methods of the present disclosure, separately or in combination with one another or one or more existing applications.

In at least one embodiment, a method as disclosed herein can include inputting, considering, processing or otherwise analyzing data associated with one or more formations or wellbores, which can include actual data collected, estimated data, predicted data, calculated data, and/or any other data according to a particular application, such as known data from operations that have taken or are taking place within or for one or more other formations or wellbores. For example, formation data can be or include data or other information gathered from wireline operations, logging-while-drilling ("LWD") operations, core tests and other testing or analyses. In at least one embodiment, a method as disclosed herein can include analyzing formation data regarding any one or more of lithology (e.g., gamma ray), resistivity, pore pressure, sonic data (e.g., oriented crossed-dipole), mechanical and other rock properties, density, temperature, pressure, overburden, wellbore stability, formation images, formation stresses, natural fractures, uni- or multi-axial compression, compression, mineralogy (e.g., x-ray detraction ("XRD"), time-dependent wellbore stability, fluid-rock interaction (e.g., capillary suction time ("CST") testing, proppant embedment, Brinnell hardness, hole size, well depth, shear, tensile forces, spalling, formation material(s), breakout, drilling induced fractures (e.g., tensile fractures), stress regions, world stress maps, in-situ stress regimes (e.g., extensional regimes, strike-slip regimes, compressional regimes), drilling instability, wellbore instability, faulting (e.g., normal faulting, strike slip faulting, reverse faulting), instabilities with and/or without consideration of anisotropy (e.g., shale anisotropy) and/or hole cleaning, flow rates, fracture size, fluid type, proppant concentration, fluid volume, proppant volume, number of fracture stages, effective confining pressure, effective mean stress, layering, formation material quality, trajectory, and efficiency, separately or in combination, in whole or in part. A method as disclosed herein can include modeling, predicting or otherwise analyzing the complexity of one or more hydraulic or other fractures in a formation. A system can include a dataset representing one or more HF factors, such as a dataset relating fracture geometry to one or more parameters that can control or otherwise affect fracture geometry resulting from hydraulic fracturing. A method as disclosed herein can include performing these steps manually, automatically or otherwise, separately or in combination, in whole or in part, and can include performing any of the steps in any order and in any number of iterations. A method as disclosed herein can include identifying one or more parameters that can control HF geometry in a formation, which can be or include any of the parameters and other factors described herein. A method as disclosed herein can include monitoring any of the parameters and other factors described herein during production operations. In at least one embodiment, which is but one of many, a method as disclosed herein can include modeling or otherwise analyzing the characteristics of a reservoir over a distance or length of a wellbore, which can be any distance according to a particular application.

In at least one embodiment, a system can be or include a computerized model of one or more of any of wellbores, formations, hydraulic fractures and the other factors, variables and attributes described herein. A system for modeling a formation can be implemented, in whole or in part, using software, such as one or more of the software applications described above. The software can include, for example, routines, programs, objects, components, and data structures for performing particular tasks or implementing particular data types, such as abstract or other data types. The interface(s) and implementations of the present disclosure may reside on a suitable computer system (which can be any computer or system of computers required by a particular application) having one or more computer processors and computer readable storage, which may be accessible through a variety of memory media, including semiconductor memory, hard disk storage, CD-ROM and other media now known or future developed. One or more embodiments of the disclosure may also cooperate with one or more other system resources, such as suitable operating systems or other resources, separately or in combination.

One or more embodiments of Applicant's disclosure can cooperate with other databases and resources available to a modeling system or network. For example, at least one implementation may cooperate with one or more databases, such as a database accessible on the same computer, over a local data bus, or through a network connection. The network connection may be a public network, such as the Internet, a private network, such as a local area network ("LAN"), or a combination of networks. Those skilled in the art having the benefits of Applicant's disclosure will appreciate that one or more embodiments of the disclosure may be implemented in a variety of computer-system configurations, or computer architectures. It will be appreciated that any number of computer systems and computer networks are acceptable for use in embodiments of the disclosure. Still further embodiments may be implemented in distributed-computing environments, such as where tasks are performed by remote-processing devices that may be linked through a communications network. In a distributed-computing environment, program modules may, but need not, be located in both local and remote computer-storage media, including memory storage devices or other media.

One or more embodiments of the disclosure can be stored on computer readable media, such as one or more hard disk drives, DVDs, CD ROMs, flash drives, or other semiconductor, magnetic or optically readable media, separately or in combination, in whole or in part. These computer storage media may carry computer readable instructions, data structures, program modules and other data representing one or more embodiments of the disclosure, or portions thereof, for loading and execution by an implementing computer system. Although one or more other internal components of a suitable computing system may not be specifically shown or described herein, those of ordinary skill in the art will appreciate that such components and their interconnection and operation are well known. In at least one embodiment of the disclosure, data federation or other techniques can be used to combine information from one or more databases, such as information regarding one or more formations or other characteristics thereof, separately or in combination with information from one or more other sources (e.g., those described elsewhere herein), into a system for optimizing a model of a hydraulic fracturing system or design. This can be accomplished according to a computer implemented process that synchronizes (e.g., periodically, continuously or otherwise) the model with, for example, the most current information about a physical oilfield formation available at a particular time or times of interest to a user. There are many sources of information that may be used to provide information into a model according to embodiments of the disclosure, such as well drilling operational databases. Also, or alternatively, a system according to the disclosure can include formation information from one or more geographical information systems, public data sources, or other sources, such as databases including information regarding materials (e.g., material factors, types or properties), component sizes (e.g., diameters, lengths, etc.), friction factors, or variables described elsewhere herein. Of course, any or all data from a particular source can be considered or otherwise used as required or desired for a particular application of an embodiment, in whole or in part, separately or in combination, and in at least some embodiments may be used to obtain other information that may not be immediately available in a particular form or format. For example, if desired formation information is not explicitly included in a source database, such information can be determined from other information in at least some cases.

With continuing reference to FIGS. 1-9 and specific reference to FIGS. 10-15, an exemplary system 300 can be or include a conventional workstation, desktop, or laptop computer, or it can be a custom computing system developed for a particular application. In at least one embodiment, the system 300 can include a bus 302 or other communication pathway for transferring information among other components within the system 300, and a central processing unit (CPU) 304 coupled with the bus 302 for processing the information. The system 300 can also include a main memory 306, such as a random access memory (RAM) or other dynamic storage device coupled to the bus 302 for storing computer-readable instructions to be executed by the CPU 304. The main memory 306 can also be used for storing temporary variables or other intermediate information during execution of the instructions by the CPU 304.

The system 300 can include a read-only memory (ROM) 308 or other static storage device coupled to the bus 302 for storing static information and instructions for the CPU 304. A computer-readable storage device 310, such as a nonvolatile memory (e.g., Flash memory) drive or magnetic disk, can be coupled to the bus 302 for storing information and instructions for the CPU 304. The CPU 304 can also be coupled via the bus 302 to a display 312 for displaying information to a user. One or more input devices 314, including alphanumeric and other keyboards, mouse, trackball, cursor direction keys, and so forth, can be coupled to the bus 302 for communicating information and command selections to the CPU 304. A communications interface 316 can be provided for allowing reservoir modelling system 300 to communicate with an external system or network. In accordance with the exemplary embodiments disclosed herein, one or more modeling applications 318, or the computer-readable instructions therefor, can also reside on or be downloaded to the storage device 310 for execution. In general, the one or more applications 318 can include one or more computer programs that can be executed by the CPU 304 and/or other components for allowing users to perform some or all the design and modeling processes described herein. Such applications 318 can be implemented in any suitable computer programming language or software development package known to those having ordinary skill in the art, including various versions of C, C++, FORTRAN, Delphi (e.g., Borland Delphi 7) and the like.

In at least one embodiment, system 300 can include one or more interfaces, such as GUI's for display on display 312, for conveying and/or receiving information. For example, system 300 can include a program GUI 320 for allowing a user to enter data for constructing a model according to the disclosure. GUI 320 can include any type of number of input fields according to an embodiment, which can include alphanumeric input fields or other input fields, such as check boxes, among others. For instance, GUI 320 (which can be or include one GUI or a plurality of GUI's) can include input fields 322 for inputting a size of a model on one or more axes, input fields 324 for inputting a number of cells along one or more axes, an entry field 326 for inputting a depth of a model, an entry field 328 for inputting an aspect ratio of a model, such as a ratio of cell dimensions or permeability, input fields 330 for inputting permeability along one or more axes, an input field 332 for inputting porosity, a check box 334 for activating a dual permeability function, input fields 336 for inputting fracture permeability along one or more axes, a check box 338 for activating a dual porosity function, an entry field 340 for inputting fracture porosity, and a button 342 for activating one or more algorithms for constructing a model according to the disclosure, separately or in combination, in whole or in part. Input can entered into GUI 320 (see FIG. 12), which can occur manually or automatically, and button 342 can be actuated (e.g., clicked or pressed) for initiating the construction or other generation of a model according to the disclosure based on the inputs into GUI 320. Of course, the inputs shown in FIG. 12 are but some of many possibilities and are discussed herein for illustrative purposes. System 300 can build a model 200 according to the disclosure and can display the model to a user via a model GUI 344 (see FIG. 13).

In at least one embodiment, system 300 can check one or more of the input data, such as to ensure that all or a portion of the data has been entered correctly. If an error is detected, system 300 can display an error GUI 346 for alerting a user to one or more errors (see FIG. 14), such as an incorrect entry into a data or input field. In at least one embodiment, system 300 can alert a user upon completion of creation of a model, which can include displaying a completion GUI 348. System 300 also can include one or more other interfaces for conveying information to a user, such as GUI's for displaying data contained in a file created during creation of a model 200, such as grid dimensions, variable values, grid data, array data, test conditions, model creation time and/or date, test results and the like. For example, in at least one embodiment, system 300 can create or display charts or tables summarizing test data, such as cumulative production versus distance (e.g., a distance from a wellhead to a center of a model), which can include data from one or more fracture zones of a reservoir.

In general, in another aspect, the exemplary embodiments can include a computer-based system for modeling a formation. The computer-based system can include a central processing unit coupled within the computer-based system, a data input unit connected to the central processing unit, the data input unit receiving data pertaining to the hydrocarbon reservoir, a database connected to the central processing unit, the database storing the data for the hydrocarbon reservoir, and a storage device connected to the central processing unit, the storage device storing computer-readable instructions therein. The computer-readable instructions can be executable by the central processing unit for performing the method(s) of modeling described above. In general, in yet another aspect, the exemplary embodiments can include a computer-readable medium, such as a non-transitory medium, storing computer-readable instructions for causing a computer to model a hydrocarbon reservoir according to the disclosure. The computer-readable instructions can include instructions for causing a computer to perform a method of modeling a reservoir as described above.

The role of the systems and methods of the present disclosure can be continuous throughout the life of a reservoir or any portion thereof, such as during exploration, well planning, development or other phases. The systems and methods disclosed herein can enhance hydrocarbon production estimations and reduce costs by minimizing guesswork associated with one or more formations or wellbores. Other and further embodiments utilizing one or more aspects of the systems and methods described above can be devised without departing from the spirit of Applicant's disclosure. For example, the systems and methods disclosed herein can be used alone or to form one or more parts of another modeling, simulation or other analysis system. Methods and systems according to the disclosure can be used for simulating development of oil and gas in various types of formations, including traditional clastic and carbonate reservoirs, fractured carbonate rocks, sandstones, shales and metamorphic rocks, among others. Alternatively, or collectively, one or more embodiments can have other applications, such as for simulation of earthquakes in the crust (e.g., as an alternative or addition to a conventional model known as "fractal Terkota" or "Terkota Fractal").

The methods and systems according to the disclosure can be used as standalone applications or as combined applications, which can include being used in combination with or in addition to one or more other systems, such as existing hydrodynamic simulation systems (e.g., Tempest MORE offered by Roxar or Eclipse offered by Schlumberger). Further, the various methods and embodiments of the workflow system can be included in combination with each other to produce variations of the disclosed embodiments. In at least one embodiment, a model can include one or more mechanical properties, such as values, representations or sets of values or representations for one or more mechanical properties of a formation or wellbore, such as for modeling one or more changes of a crack or other opening caused by reservoir pressure in a reservoir during development. Discussion of singular elements can include plural elements and vice-versa. References to at least one item followed by a reference to the item may include one or more items. Also, various aspects of the embodiments can be used in conjunction with each other. Unless the context requires otherwise, the words "include," "comprise" and variations thereof should be understood to imply the inclusion of at least the stated element or step or group of elements or steps or equivalents thereof, and not the exclusion of a greater numerical quantity or any other element or step or group of elements or steps or equivalents thereof. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

As will be appreciated by those skilled in the art, one or more embodiments of the present disclosure may be embodied as a method, data processing system, or computer program product. Accordingly, at least one embodiment can take the form of an entirely hardware embodiment, an entirely software embodiment, or an embodiment combining software and hardware aspects. Furthermore, at least one embodiment may be a computer program product on a computer-usable storage medium having computer readable program code on the medium. Any suitable computer readable medium may be utilized including, but not limited to, static and dynamic storage devices, hard disks, optical storage devices, and magnetic storage devices.

At least one embodiment may be described herein with reference to flowchart illustrations of methods, systems, and computer program products according to the disclosure. It will be understood that each block of a flowchart illustration, and combinations of blocks in flowchart illustrations, can be implemented by computer program instructions. These computer program instructions may be provided to a processor of a general purpose computer, special purpose computer, or other programmable data processing apparatus to produce a machine, such that the instructions, which can execute via a processor of a computer or other programmable data processing apparatus, can implement the functions specified in the flowchart block or blocks, separately or in combination, in whole or in part. The computer program instructions may be stored in a computer-readable memory that can direct a computer or other programmable data processing apparatus to function in a particular manner, such that the instructions stored in the computer-readable memory result in an article of manufacture including instructions which can implement the function(s) specified in the flowchart block or blocks. The computer program instructions may be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

In at least one embodiment, an electronically stored model for a reservoir can include a plurality of hierarchical levels and a plurality of cells representing corresponding portions of the reservoir. The model can include a dimension and a cell number corresponding to the reservoir. A dimension of a cell of an nth hierarchical level can be defined in terms of a dimension of a cell of a first hierarchical level and an array of vertex coordinates along one or more axes can be generated. The model can include a ratio of dimensions among hierarchical levels for improved reservoir modeling, such as a ratio of 1.618. The model can include a ratio of permeability among hierarchical levels for improved reservoir modeling, such as a ratio of 1.618.

In at least one embodiment, a computer-implemented method of modeling a reservoir can comprise creating, in computer readable storage, an electronically stored model comprising a plurality of hierarchical levels, wherein each of the plurality of hierarchical levels comprises a plurality of cells representing corresponding portions of a reservoir. The method can include inputting 402, receiving or processing one or more dimensions, such as an overall dimension(s), or numbers of cells, of the reservoir along one or more axes, which can include a first, second, third, X, Y, Z or other axis.

The method can include defining 404, calculating, processing or creating a dimension of a cell of one or more hierarchical levels, such as a first hierarchical level, along one or more axes according to Equation 3, and can include defining 406, calculating, processing or creating a dimension of a cell of one or more other hierarchical levels, such as an nth hierarchical level, along the one or more axes according to Equation 1. The method can include defining, calculating 408, processing or creating a dimension of a cell along an axis for each of the plurality of hierarchical levels and generating 408 one or more arrays, such as a first array, of vertex coordinates along the axis. An array of vertex coordinates can include a zero coordinate and a last coordinate on an axis.

In at least one embodiment, a method can include defining 412, calculating, processing or creating a dimension of a model along one or more axes according to Equation 2. In at least one embodiment, a zero coordinate can correspond to a peak, such as a first peak, and a last coordinate can be equal to Xs. The method can include at least one of changing 414 a size of at least one cell in a preexisting reservoir model, reducing 416 a number of cells in a preexisting reservoir model, and a combination thereof, which can include maintaining an overall size of the preexisting reservoir model (or a portion thereof) the same. In at least one embodiment, a method can include defining 418 a ratio of hierarchy levels ($\tau$) as 1.618 for at least one aspect of the model, such as one or more dimensions or one or more permeabilities.

In at least one embodiment, a method can include inputting 420, receiving, defining, calculating, processing or creating a dimension, such as an overall dimension, of a reservoir along a second, third or other axis, as well as a number of cells along the axis. The method can include defining 422, calculating, processing or creating a dimension of a cell of one or more levels, such as a first hierarchical level, along the second, third or other axis according to Equation 3, wherein the variable X in Equation 3 can, but need not, be a Y, Z or other character. The method can include defining 424, calculating, processing or creating a dimension of a cell of an nth hierarchical level along the second, third or other axis according to Equation 1, wherein the variable X in Equation 3 can, but need not, be a Y, Z or other character, and can include defining 426, calculating, processing or creating a dimension of a cell along the axis for each of the plurality of hierarchical levels. The method can include generating 428 one or more additional arrays, such as second, third or other arrays, of vertex coordinates along the axis, which array(s) can include a zero coordinate and a last coordinate on the axis. Two or more of the axes can be perpendicular to one another. The method can include defining 430 a dimension for each of a plurality of cells in each of a plurality of hierarchical levels along one or more other axes, such as a third axis, and can include displaying an electronically stored model on a display. In at least one embodiment, a method can include inputting, receiving, defining, calculating, processing or creating 432 a fracture permeability of one or more of a plurality of hierarchical levels in one or more directions, which can include determining a fracture permeability of an nth hierarchical level according to Equation 4. The method can include defining a ratio of hierarchy levels ($\tau$) as 1.618 for one or more attributes of a model, such as one or more dimensions or one or more permeabilities.

In general, in another aspect, the exemplary embodiments include a computer-based system for modeling a reservoir. A computer-based system according to the disclosure can include a processing unit, such as a unit mounted within the computer-based system, a data input unit connected to the central processing unit, the data input unit receiving data for a reservoir, such as a hydrocarbon reservoir, a database connected to the central processing unit, the database storing the data for the reservoir, and a storage device connected to the central processing unit, the storage device storing computer-readable instructions, such as therein or thereon. The computer-readable instructions can be executable by the central processing unit to perform one or more of the methods of modeling a reservoir substantially as described above. In general, in yet another aspect, the exemplary embodiments include a computer-readable medium storing computer-readable instructions for causing a computer to model a reservoir, which can include creating one or more reservoir models substantially as described in the present disclosure. The computer-readable instructions can include instructions for causing a computer to perform one or more of the methods of modeling a reservoir substantially as described above, which can include creating one or more reservoir models substantially as described in the present disclosure.

While the disclosed embodiments have been described with reference to one or more particular implementations, those skilled in the art will recognize that many changes may be made thereto without departing from the spirit and scope of the description and that obvious modifications and alterations to the described embodiments are available. Accordingly, each of these embodiments and obvious variations thereof is contemplated as falling within the scope of the disclosure and, in conformity with the patent laws, Applicant intends to fully protect all such modifications and improvements that come within the scope or range of equivalents of the following claims.

What is claimed is:

1. A computer-implemented method of modeling a fractured oil and/or gas reservoir, comprising:
creating, in non-transitory computer readable storage, an electronically stored model comprising a plurality of hierarchical levels, wherein each of the plurality of hierarchical levels comprises a plurality of cells representing corresponding portions of the reservoir,
wherein creating the electronically stored model comprises
inputting an overall dimension of the reservoir along a first axis;
inputting a number of cells along the first axis;
defining a dimension of a cell of a first hierarchical level along the first axis as $$x_1 = \frac{X_S}{1 + \sum_{i=2}^{n} \tau^{i-1}},$$

where $$n = \frac{X_c - 1}{2},$$

if an add number of cells along the first axis, or $$x_1 = \frac{X_S}{2 + \sum_{i=2}^{n} \tau^{i-1}},$$

where $$n = \frac{Xc}{2} - 1,$$

if an even number of cells along the first axis,
wherein $x_1$ is the dimension of the cell of the first hierarchical level along the first axis, Xs is the size of the model along the first axis in nominal units, n is the hierarchical level, i is the initial hierarchical level, $\tau$ is the ratio of hierarchy levels and Xc is the number of cells in the nth hierarchical level along the first axis;
defining a dimension of a cell of an nth hierarchical level along the first axis as $x_n = \tau^{n-1} \cdot x_1$, wherein $x_n$ is the dimension of the cell of the nth hierarchical level along the first axis;
calculating a dimension of a cell along the first axis for each of the plurality of hierarchical levels; and
generating a first array of vertex coordinates along the first axis, the first array of vertex coordinates including a zero coordinate and a last coordinate on the first axis;
simulating one or more cracks in the reservoir by approximating a position of the one or more cracks in one or more of the plurality of hierarchical levels using the calculated dimensions of cells along the first axis for said one or more of the plurality of hierarchical levels and displaying one or more of the simulated cracks on a graphical user interface in the form of mesh lines shown in relation to an image of blocks according to the first array of vertex coordinates along the first axis and representing a portion of the modeled reservoir having one or more cracks; and
estimating production from the reservoir by modeling the production behavior of the reservoir with the electronically stored model and the one or more simulated cracks.

2. The method of claim 1, further comprising defining a dimension of the model along the first axis as $$Xs = \left(1 + \sum_{i=2}^{n} \tau^{i-1}\right) \cdot x_1, \text{ where } n = \frac{Xc-1}{2},$$

if an odd number of cells along the first axis, or $$Xs = \left(2 + \sum_{i=2}^{n} \tau^{i-1}\right) \cdot x_1, \text{ where } n = \frac{Xc}{2} - 1,$$

if an even number of cells along the first axis.

3. The method of claim 1, further comprising wherein the zero coordinate corresponds to a first peak.

4. The method of claim 1, further comprising wherein the last coordinate is equal to Xs.

5. The method of claim 1, further comprising changing a size of at least one cell in a preexisting reservoir model.

6. The method of claim 1, further comprising reducing a number of cells in a preexisting reservoir model.

7. The method of claim 1, further comprising defining a ratio of hierarchy levels ($\tau$) for cell dimensions as 1.618.

8. The method of claim 1, further comprising:
inputting an overall dimension of the reservoir along a second axis;
inputting a number of cells along the second axis;
defining a dimension of a cell of a first hierarchical level along the second axis as $$y_1 = \frac{Ys}{1 + \sum_{i=2}^{n} \tau^{i-1}}, \text{ where } n = \frac{Yc-1}{2},$$

if an odd number of cells along the second axis, or $$y_1 = \frac{Ys}{2 + \sum_{i=2}^{n} \tau^{i-1}}, \text{ where } n = \frac{Yc}{2} - 1,$$

if an even number of cells along the second axis;
wherein $y_1$ is the dimension of the cell of the first hierarchical level along the second axis, Ys is the size of the model along the second axis in nominal units and Yc is the number of cells in the nth hierarchical level along the second axis;
defining a dimension of a cell of an nth hierarchical level along the second axis as $y_n = \tau^{n-1} \cdot y_1$, wherein $y_n$ is the dimension of the cell of the nth hierarchical level along the second axis;
calculating a dimension of a cell along the second axis for each of the plurality of hierarchical levels; and
generating a second array of vertex coordinates along the second axis, the second array of vertex coordinates including a zero coordinate and a last coordinate on the second axis.

9. The method of claim 8, further comprising wherein the first axis is perpendicular to the second axis.

10. The method of claim 8, further comprising:
defining a dimension for each of the plurality of cells in each of the plurality of hierarchical levels along a third axis; and
displaying the electronically stored model on a display.

11. The method of claim 1, further comprising determining a fracture permeability of one or more of the plurality of hierarchical levels in one or more directions.

12. The method of claim 11, further comprising determining the fracture
permeability of an nth hierarchical level according to the equation $$k_n = \begin{cases} \frac{k_1}{\tau^{n-1}}, & \frac{k_1}{\tau^{n-1}} > k_0 \\ k_0, & \frac{k_1}{\tau^{n-1}} \leq k_0 \end{cases},$$

wherein $k_n$ is the fracture permeability of the nth hierarchical level, $k_1$ is the permeability of a fracture of a 1st hierarchical level and $k_0$ is the average matrix permeability.

13. The method of claim 12, further comprising defining a ratio of hierarchy levels ($\tau$) for fracture permeability as 1.618.

14. A computer-based system for modeling a fractured oil and/or gas reservoir, comprising:
- a central processing unit mounted within the computer-based system;
- a data input unit connected to the central processing unit, the data input unit being configured to receive data pertaining to the reservoir;
- a database connected to the central processing unit, the database storing at least a portion of the data pertaining to the reservoir; and
- a non-transitory storage device connected to the central processing unit, the storage device storing computer-readable instructions executable by the central processing unit to:
  - create an electronically stored model of the reservoir comprising a plurality of hierarchical levels, wherein each of the plurality of hierarchical levels comprises a plurality of cells representing corresponding portions of the reservoir;
  - define an overall dimension of the model along a first axis;
  - define a number of cells along the first axis;
  - define a dimension of a cell of a first hierarchical level along the first axis as $$x_1 = \frac{Xs}{1 + \sum_{i=2}^{n} \tau^{i-1}}, \text{ where } n = \frac{Xc - 1}{2},$$

if an odd number of cells along the first axis, or $$x_1 = \frac{Xs}{2 + \sum_{i=2}^{n} \tau^{i-1}}, \text{ where } n = \frac{Xc}{2} - 1,$$

if an even number of cells along the first axis,
  - wherein $x_1$ is the dimension of the cell of the first hierarchical level along the first axis, Xs is the size of the model along the first axis in nominal units, n is the hierarchical level, i is the initial hierarchical level, $\tau$ is the ratio of hierarchy levels and Xc is the number of cells in the nth hierarchical level along the first axis;
  - define a dimension of a cell of an nth hierarchical level along the first axis as $x_n = \tau^{n-1} \cdot x_1$, wherein $x_n$ is the dimension of the cell of the nth hierarchical level along the first axis;
  - calculate a dimension of a cell along the first axis for each of the plurality of hierarchical levels;
  - generate a first array of vertex coordinates along the first axis, the first array of vertex coordinates including a zero coordinate and a last coordinate on the first axis;
  - simulate one or more cracks in the reservoir by approximating a position of the one or more cracks in one or more of the plurality of hierarchical levels using the calculated dimensions of cells along the first axis for said one or more of the plurality of hierarchical levels and display one or more of the simulated cracks on a graphical user interface in the form of mesh lines shown in relation to an image of blocks according to the first array of vertex coordinates along the first axis and representing a portion of the modeled reservoir having one or more cracks; and
  - estimate production from the reservoir by modeling the production behavior from the reservoir with the electronically stored model and the one or more simulated cracks.

15. The computer-based system of claim 14, further comprising wherein the computer-readable instructions are executable by the central processing unit to define a dimension of the model along the first axis as $$Xs = \left(1 + \sum_{i=2}^{n} \tau^{i-1}\right) \cdot x_1, \text{ where } n = \frac{Xc - 1}{2},$$

if an odd number of cells along the first axis, or $$Xs = \left(2 + \sum_{i=2}^{n} \tau^{i-1}\right) \cdot x_1, \text{ where } n = \frac{Xc}{2} - 1,$$

if an even number of cells along the first axis.

16. The computer-based system of claim 14, further comprising wherein the model includes a ratio of hierarchy levels ($\tau$) equal to 1.618.

17. A non-transitory computer-readable medium storing computer-readable instructions for causing a computer to model a fractured oil and/or gas reservoir, the computer-readable instructions comprising instructions that, when executed by a processor, cause the computer to:
- create, in computer readable storage, an electronically stored model comprising a plurality of hierarchical levels, wherein each of the plurality of hierarchical levels comprises a plurality of cells representing corresponding portions of the reservoir;
- define an overall dimension of the model along a first axis;
- define a number of cells along the first axis;
- define a dimension of a cell of a first hierarchical level along the first axis as $$x_1 = \frac{Xs}{1 + \sum_{i=2}^{n} \tau^{i-1}}, \text{ where } n = \frac{Xc - 1}{2},$$

if an odd number of cells along the first axis, or $$x_1 = \frac{Xs}{2 + \sum_{i=2}^{n} \tau^{i-1}}, \text{ where } n = \frac{Xc}{2} - 1,$$

if au even numbers of cells along the first axis,
  - wherein $x_1$ is the dimension of the cell of the first hierarchical level along the first axis, Xs is the size of the model along the first axis in nominal units, n is the hierarchical level, i is the initial hierarchical level, r is the ratio of hierarchy levels and Xc is the number of cells in the nth hierarchical level along the first axis;
- define a dimension of a cell of an nth hierarchical level along the first axis as $x_n = \tau^{n-1} \cdot x_1$, wherein $x_n$ is the dimension of the cell of the nth hierarchical level along the first axis;
- calculate a dimension of a cell along the first axis for each of the plurality of hierarchical levels;
- generate a first array of vertex coordinates along the first axis, the first array of vertex coordinates including a zero coordinate and a last coordinate on the first axis;
- simulate one or more cracks in the reservoir by approximating a position of the one or more cracks in one or more of the plurality of hierarchical levels using the calculated dimensions of cells along the first axis for said one or more of the plurality of hierarchical levels and display one or more of the simulated cracks on a graphical user interface in the form of mesh lines shown in relation to an image of blocks according to the first array of vertex coordinates along the first axis and representing a portion of the modeled reservoir having one or more cracks; and estimate production from the reservoir by modeling the production behavior of the reservoir with the electronically stored model and the one or more simulated cracks.

18. The computer-readable medium of claim 17, further comprising instructions that, when executed by a processor, cause the computer to define a dimension of the model along the first axis as $$Xs = \left(1 + \sum_{i=2}^{n} \tau^{i-1}\right) \cdot x_1, \text{ where } n = \frac{Xc-1}{2},$$

if an odd number of cells along the first axis, or $$Xs = \left(2 + \sum_{i=2}^{n} \tau^{i-1}\right) \cdot x_1, \text{ where } n = \frac{Xc}{2} - 1,$$

if an even lumber of cells along the first axis.

19. The computer-readable medium of claim 17, further comprising instructions that, when executed by a processor, cause the computer to create the model with a ratio of hierarchy levels ($\tau$) equal to 1.618.

20. The computer-readable medium of claim 17, further comprising instructions that, when executed by a processor, cause the computer to create the model by at least one of reducing a number of cells in a preexisting reservoir model, reducing a size of a cell in a preexisting reservoir model and a combination thereof.

* * * * *